United States Patent
Shibuya et al.

(10) Patent No.: US 9,576,693 B2
(45) Date of Patent: Feb. 21, 2017

(54) METAL MATERIAL FOR ELECTRONIC COMPONENT AND METHOD FOR MANUFACTURING THE SAME

(75) Inventors: Yoshitaka Shibuya, Ibaraki (JP); Kazuhiko Fukamachi, Ibaraki (JP); Atsushi Kodama, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 0 days.

(21) Appl. No.: 14/346,025

(22) PCT Filed: Sep. 10, 2012

(86) PCT No.: PCT/JP2012/073095
§ 371 (c)(1),
(2), (4) Date: Jun. 10, 2014

(87) PCT Pub. No.: WO2013/042572
PCT Pub. Date: Mar. 28, 2013

(65) Prior Publication Data
US 2014/0329107 A1  Nov. 6, 2014

(30) Foreign Application Priority Data
Sep. 20, 2011 (JP) .................. 2011-205371
Feb. 17, 2012 (JP) .................. 2012-033265

(51) Int. Cl.
*B32B 15/00* (2006.01)
*H01B 1/02* (2006.01)
(Continued)

(52) U.S. Cl.
CPC .............. *H01B 1/02* (2013.01); *B32B 15/01* (2013.01); *B32B 15/018* (2013.01); *C22C 5/06* (2013.01);
(Continued)

(58) Field of Classification Search
None
See application file for complete search history.

(56) References Cited

U.S. PATENT DOCUMENTS 3,648,355 A   3/1972   Shida et al.
5,075,176 A  12/1991  Brinkmann
(Continued)

FOREIGN PATENT DOCUMENTS

EP  0033644 A1  8/1981
JP  61-124597 A  6/1986
(Continued)

OTHER PUBLICATIONS

Office Action of U.S. Appl. No. 13/818,455, dated May 16, 2016.
(Continued)

*Primary Examiner* — Daniel J Schleis
(74) *Attorney, Agent, or Firm* — Drinker Biddle & Reath LLP

(57) ABSTRACT

There are provided a metal material for electronic component which has low insertability/extractability, low whisker formability, and high durability, and a method for manufacturing the metal material. The metal material 10 for electronic components has a base material 11, an A layer 14 constituting a surface layer on the base material 11 and formed of Sn, In or an alloy thereof, and a B layer 13 constituting a middle layer provided between the base material 11 and the A layer 14 and formed of Ag, Au, Pt, Pd, Ru, Rh, Os, Ir or an alloy thereof, wherein the surface layer (A layer) 14 has a thickness of 0.002 to 0.2 μm, and the middle layer (B layer) 13 has a thickness of 0.001 to 0.3 μm.

21 Claims, 2 Drawing Sheets

(51) Int. Cl.

| | | |
|---|---|---|
| *B32B 15/01* | (2006.01) | |
| *C25D 5/10* | (2006.01) | |
| *C22C 5/06* | (2006.01) | |
| *C22C 5/08* | (2006.01) | |
| *C22C 5/10* | (2006.01) | |
| *C22C 9/00* | (2006.01) | |
| *C22C 9/02* | (2006.01) | |
| *C22C 9/04* | (2006.01) | |
| *C22C 13/00* | (2006.01) | |
| *C22C 19/03* | (2006.01) | |
| *C22C 19/07* | (2006.01) | |
| *C22C 22/00* | (2006.01) | |
| *C22C 27/06* | (2006.01) | |
| *C22C 38/00* | (2006.01) | |
| *C22C 13/02* | (2006.01) | |
| *H05K 3/24* | (2006.01) | |
| *C25D 5/50* | (2006.01) | |
| *C25D 5/12* | (2006.01) | |
| *C23C 18/16* | (2006.01) | |
| *H05K 1/11* | (2006.01) | |
| *H01R 13/03* | (2006.01) | |
| *C25D 3/12* | (2006.01) | |
| *C25D 3/20* | (2006.01) | |
| *C25D 3/30* | (2006.01) | |
| *C25D 3/38* | (2006.01) | |
| *C25D 3/46* | (2006.01) | |
| *C25D 3/50* | (2006.01) | |
| *C25D 3/56* | (2006.01) | |
| *C25D 3/62* | (2006.01) | |
| *C25D 3/64* | (2006.01) | |

(52) U.S. Cl.
CPC . *C22C 5/08* (2013.01); *C22C 5/10* (2013.01); *C22C 9/00* (2013.01); *C22C 9/02* (2013.01); *C22C 9/04* (2013.01); *C22C 13/00* (2013.01); *C22C 13/02* (2013.01); *C22C 19/03* (2013.01); *C22C 19/07* (2013.01); *C22C 22/00* (2013.01); *C22C 27/06* (2013.01); *C22C 38/00* (2013.01); *C23C 18/1651* (2013.01); *C23C 18/1692* (2013.01); *C25D 5/10* (2013.01); *C25D 5/12* (2013.01); *C25D 5/505* (2013.01); *H05K 3/244* (2013.01); *C25D 3/12* (2013.01); *C25D 3/20* (2013.01); *C25D 3/30* (2013.01); *C25D 3/38* (2013.01); *C25D 3/46* (2013.01); *C25D 3/50* (2013.01); *C25D 3/567* (2013.01); *C25D 3/62* (2013.01); *C25D 3/64* (2013.01); *H01R 13/03* (2013.01); *H05K 1/117* (2013.01); *H05K 1/118* (2013.01); *H05K 2201/0341* (2013.01); *Y10T 428/12681* (2015.01); *Y10T 428/12708* (2015.01); *Y10T 428/12715* (2015.01); *Y10T 428/12722* (2015.01)

(56) References Cited

U.S. PATENT DOCUMENTS

| | | | |
|---|---|---|---|
| 6,548,898 B2 * | 4/2003 | Matsuki | ............ H01L 23/49811 257/701 |
| 7,147,933 B2 | 12/2006 | Strobel | |
| 7,808,109 B2 | 10/2010 | Chen et al. | |
| 7,922,545 B2 | 4/2011 | Saitoh | |
| 8,426,742 B2 * | 4/2013 | Ejiri | .................... C23C 18/1651 174/126.2 |
| 2004/0038072 A1 | 2/2004 | Miura | ........................ 428/668 |
| 2004/0161626 A1 | 8/2004 | Kwon et al. | |
| 2005/0106408 A1 | 5/2005 | Chen et al. | |
| 2005/0176267 A1 | 8/2005 | Saitoh | |
| 2006/0292847 A1 | 12/2006 | Schetty | |
| 2008/0188100 A1 | 8/2008 | Saitoh | |
| 2010/0255735 A1 | 10/2010 | Moriuchi et al. | |
| 2011/0012497 A1 * | 1/2011 | Sumiya | .................. B32B 15/01 313/113 |
| 2012/0009496 A1 | 1/2012 | Shibuya | |
| 2012/0107639 A1 | 5/2012 | Takamizawa et al. | |
| 2015/0147924 A1 | 5/2015 | Shibuya et al. | |
| 2015/0171537 A1 | 6/2015 | Shibuya et al. | |
| 2015/0194746 A1 | 7/2015 | Shibuya et al. | |
| 2015/0295333 A1 | 10/2015 | Shibuya et al. | |

FOREIGN PATENT DOCUMENTS

| | | |
|---|---|---|
| JP | 01-306574 A | 12/1989 |
| JP | 02-301573 A | 12/1990 |
| JP | 04-160200 A | 6/1992 |
| JP | 04-370613 A | 12/1992 |
| JP | 05-311495 A | 11/1993 |
| JP | 09-078287 A | 3/1997 |
| JP | 11-121075 A | 4/1999 |
| JP | 11-229178 A | 8/1999 |
| JP | 11-350188 A | 12/1999 |
| JP | 11-350189 A | 12/1999 |
| JP | 2003-129278 A | 5/2003 |
| JP | 2004079486 A | 3/2004 |
| JP | 2004176107 A | 6/2004 |
| JP | 2004190065 A | 7/2004 |
| JP | 2005-126763 A | 5/2005 |
| JP | 2005-226089 A | 8/2005 |
| JP | 2005-353542 A | 12/2005 |
| JP | 2006127939 A | 5/2006 |
| JP | 2006-152389 A | 6/2006 |
| JP | 2008021501 A | 1/2008 |
| JP | 2010-138452 A | 6/2010 |
| JP | 2010-262861 A | 11/2010 |
| JP | 2011-012320 A | 1/2011 |
| JP | 2011-026677 A | 2/2011 |
| JP | 2011-122234 A | 6/2011 |
| JP | 2012-036436 A | 2/2012 |
| WO | 2005038989 A2 | 4/2005 |
| WO | WO2010119489 * | 10/2010 |
| WO | WO-2011/001737 A1 | 1/2011 |

OTHER PUBLICATIONS

European Search Report for European Application No. 12834344.9 dated Feb. 12, 2016.
Office Action for U.S Appl. No. 14/432,978 dated Oct. 27, 2015.
Office Action for U.S Appl. No. 14/375,333 dated Aug. 14, 2015.
Office Action for U.S Appl. No. 14/375,333 dated Mar. 28, 2016.

* cited by examiner

US 9,576,693 B2

METAL MATERIAL FOR ELECTRONIC COMPONENT AND METHOD FOR MANUFACTURING THE SAME

TECHNICAL FIELD

The present invention relates to a metal material for electronic component and a method for manufacturing the metal material.

BACKGROUND ART

For connectors being connection components for household and vehicular electronic devices, materials are used in which a Ni or Cu base undercoat plating is carried out on the surface of brass or phosphorus bronze, and an Sn or Sn alloy plating is further carried out thereon. The Sn or Sn alloy plating usually requires properties of low contact resistance and high solder wettability, and there is recently further demanded the reduction of the inserting force in engagement of a male terminal and a female terminal formed by press working of plating materials. On the plating surface in manufacture steps, there is in some cases generated whiskers, which are needle crystals causing problems such as short-circuit, and the whiskers also need to be suppressed well.

By contrast, Patent Literature 1 discloses a silver-coated electric material in which on a base material whose surface layer has a thickness of 0.05 µm or larger from the surface of the base material and is composed of Ni, Co or an alloy thereof, Ag or an Ag alloy is partially coated, and on the exposed base material surface and on the partially coated Ag or Ag alloy layer, In, Zn, Sn, Pd or an alloy thereof is coated in a thickness of 0.01 to 1.0 µm. According to the Patent Literature, it is described that the electric material can maintain the solderability excellent as an electric material and the sustainability of the mechanical electric connection over a long period.

Patent Literature 2 discloses an Sn or Sn alloy-coated material in which a first coating layer of Ni, Co or an alloy containing these is provided on a Cu or Cu alloy base material surface, and a second coating layer of Ag or an Ag alloy is provided thereon, and an Sn or Sn alloy coating layer is further provided thereon. According to the Patent Literature, it is described that there can be provided an Sn or Sn alloy-coated material which exhibits no oxidative discoloration of the surface and little increase in the contact resistance in spite of being used at high temperatures, thus exhibiting good appearance and contact property over a long period.

Patent Literature 3 discloses an Sn or Sn alloy-coated material in which a first coating layer of Ni, Co or an alloy containing these is provided on a Cu or Cu alloy base material surface, and a second coating layer of Ag or an Ag alloy is provided thereon, and a hot-dipped solidified coating layer of Sn or an Sn alloy is further provided thereon. According to the Patent Literature, it is described that there can be provided an Sn or Sn alloy-coated material which exhibits no oxidative discoloration of the surface and little increase in the contact resistance in spite of being used at high temperatures, thus exhibiting good appearance and contact property over a long period.

Patent Literature 4 discloses an electric contact material in which an Ag layer or an Ag alloy layer is coated on one surface of a conductive strip, and an Sn layer or an Sn alloy layer is coated on the other surface. According to the Patent Literature, it is described that there can be provided an electric contact material or an electric contact component exhibiting little deterioration of solderability even if being exposed to the sulfurization environment or the like.

Patent Literature 5 discloses a method for preventing tin whiskers by a pretreatment in which method (a) one of underlayer metal thin films selected from the group consisting of silver, palladium, platinum, bismuth, indium, nickel, zinc, titanium, zirconium, aluminum, chromium and antimony is formed on a plating object, and thereafter, (b) a tin or tin alloy plating film is formed on the underlayer metal thin film. According to the Patent Literature, it is described that in the tin-based film formed to well secure solderability and the like on the surface of a plating object including a copper-based bare surface, tin whiskers can effectively be prevented by a simple operation.

Patent Literature 6 discloses a plating structure obtained by heat-treating a silver plating structure in which a silver plating layer is formed on the surface of a substrate for plating, and a tin, indium or zinc plating layer of a thickness of 0.001 to 0.1 µm is further formed on the surface of the silver plating layer. According to the Patent Literature, it is described that there can be provided a support, for housing light emitting elements, being excellent in heat resistance and exhibiting little decrease in the reflectance due to sulfurization of silver, and a coating method of electric components which provides electronic components hardly undergoing discoloration due to sulfurization, having gloss innate in silver, and having a low contact resistance.

CITATION LIST

Patent Literature

Patent Literature 1—Japanese Patent Laid-Open No. 61-124597
Patent Literature 2—Japanese Patent Laid-Open No. 1-306574
Patent Literature 3—Japanese Patent Laid-Open No. 2-301573
Patent Literature 4—Japanese Patent Laid-Open No. 9-78287
Patent Literature 5—Japanese Patent Laid-Open No. 2003-129278
Patent Literature 6—Japanese Patent Laid-Open No. 2011-122234

SUMMARY OF INVENTION

Technical Problem

However, the technology described in Patent Literature 1 has such a problem that the contact resistance in the region where Sn is formed ultrathin becomes high.

The technologies described in Patent Literatures 2 to 5 give good solder wettability and contact property, but cannot be said to give the satisfactory insertability/extractability and the satisfactory suppression of whiskers.

The technology described in Patent Literature 6, though improving the contact resistance, cannot be said to give the satisfactory solder wettability.

The conventional metal materials for electronic components having an Sn/Ag/Ni base plating structure have thus problems in the insertability/extractability and the whiskers; and even if specifications are made which pose no problems in the insertability/extractability and the whiskers, the specifications are difficult to make so as to satisfy the durability (heat resistance, gas corrosion resistance, high solder wettability), which are not made clear.

The present invention has been achieved to solve the above-mentioned problems, and has objects of providing a metal material for electronic component, having low insertability/extractability (low insertability/extractability refers to a low insertion force produced when a male terminal and a female terminal are engaged), low whisker formability and high durability, and a method for manufacturing the metal material.

Solution to Problem

As a result of exhaustive studies, the present inventors have found that a metal material for electronic component which has all of low insertability/extractability, low whisker formability and high durability can be fabricated by providing a middle layer and a surface layer in order on a base material, using predetermined metals as the middle layer and the surface layer, respectively, and forming these in predetermined thicknesses or deposition amounts, respectively.

One aspect of the present invention completed based on the above finding is a metal material for electronic component, having low whisker formability and high durability which comprises a base material, an A layer constituting a surface layer on the base material and formed of Sn, In or an alloy thereof, and a B layer constituting a middle layer provided between the base material and the A layer and formed of Ag, Au, Pt, Pd, Ru, Rh, Os, Ir or an alloy thereof, wherein the surface layer (A layer) has a thickness of 0.002 to 0.2 μm, and the middle layer (B layer) has a thickness of 0.001 to 0.3 μm.

Another aspect of the present invention is a metal material for electronic component, having low whisker formability and high durability which comprises a base material, an A layer constituting a surface layer on the base material and formed of Sn, In or an alloy thereof, and a B layer constituting a middle layer provided between the base material and the A layer and formed of Ag, Au, Pt, Pd, Ru, Rh, Os, Ir or an alloy thereof, wherein the surface layer (A layer) has a deposition amount of Sn, In of 1 to 150 μg/cm$^2$, and the middle layer (B layer) has a deposition amount of Ag, Au, Pt, Pd, Ru, Rh, Os, Ir of 1 to 330 μg/cm$^2$.

In one embodiment of the metal material for electronic component according to the present invention, the surface layer (A layer) has an alloy composition comprising 50 mass % or more of Sn, In or the total of Sn and In, and the other alloy component(s) comprising one or two or more elements selected from the group consisting of Ag, As, Au, Bi, Cd, Co, Cr, Cu, Fe, Mn, Mo, Ni, Pb, Sb, W, Zn.

In another embodiment of the metal material for electronic component according to the present invention, the middle layer (B layer) has an alloy composition comprising 50 mass % or more of Ag, Au, Pt, Pd, Ru, Rh, Os, Ir or the total of Ag, Au, Pt, Pd, Ru, Rh, Os and Ir, and the other alloy component(s) comprising one or two or more elements selected from the group consisting of Bi, Cd, Co, Cu, Fe, In, Mn, Mo, Ni, Pb, Sb, Se, Sn, W, Tl, Zn.

In further another embodiment of the metal material for electronic component according to the present invention, the surface layer (A layer) has a surface Vickers hardness of Hv300 or higher.

In further another embodiment of the metal material for electronic component according to the present invention, the surface layer (A layer) has a surface indentation hardness of 2,500 MPa or higher, the indentation hardness being a hardness acquired by measuring an impression made on the surface of the surface layer (A layer) by a load of 0.1 mN in an ultrafine hardness test.

In further another embodiment of the metal material for electronic component according to the present invention, the surface layer (A layer) has a surface Vickers hardness of Hv1,000 or lower.

In further another embodiment of the metal material for electronic component according to the present invention, the surface layer (A layer) has a surface indentation hardness of 10,000 MPa or lower, the indentation hardness being a hardness acquired by measuring an impression made on the surface of the surface layer (A layer) by a load of 0.1 mN in an ultrafine hardness test.

In further another embodiment of the metal material for electronic component according to the present invention, the surface layer (A layer) has a surface arithmetic mean deviation (Ra) of 0.1 μm or lower.

In further another embodiment of the metal material for electronic component according to the present invention, the surface layer (A layer) has a surface maximum height (Rz) of 1 μm or lower.

In further another embodiment of the metal material for electronic component according to the present invention, the surface layer (A layer) has a surface reflection density of 0.3 or higher.

In further another embodiment of the metal material for electronic component according to the present invention, when a depth analysis by XPS (X-ray photoelectron spectroscopy) is carried out, a position ($D_1$) where the atomic concentration (at %) of Sn or In of the surface layer (A layer) is a maximum value and a position ($D_2$) where the atomic concentration (at %) of Ag, Au, Pt, Pd, Ru, Rh, Os or Ir of the middle layer (B layer) is a maximum value are present in the order of $D_1$ and $D_2$ from the surface.

In further another embodiment of the metal material for electronic component according to the present invention, when a depth analysis by XPS (X-ray photoelectron spectroscopy) is carried out, the surface layer (A layer) has a maximum value of an atomic concentration (at %) of Sn or In of 10 at % or higher.

In further another embodiment of the metal material for electronic component according to the present invention, when a depth analysis by XPS (X-ray photoelectron spectroscopy) is carried out, the middle layer (B layer) has a maximum value of an atomic concentration (at %) of Ag, Au, Pt, Pd, Ru, Rh, Os or Ir of 10 at % or higher.

In further another embodiment of the metal material for electronic component according to the present invention, the surface layer (A layer) has a thickness of 0.01 to 0.1 μm.

In further another embodiment of the metal material for electronic component according to the present invention, the surface layer (A layer) has a deposition amount of Sn, In of 7 to 75 μg/cm$^2$.

In further another embodiment of the metal material for electronic component according to the present invention, the middle layer (B layer) has a thickness of 0.005 to 0.1 μm.

In further another embodiment of the metal material for electronic component according to the present invention, the middle layer (B layer) has a deposition amount of Ag, Au, Pt, Pd, Ru, Rh, Os, Ir of 4 to 120 μg/cm$^2$.

In further another embodiment of the metal material for electronic component according to the present invention, the metal material further comprises a C layer provided between the base material and the B layer and constituting an underlayer, and formed of one or two or more selected from the group consisting of Ni, Cr, Mn, Fe, Co, Cu.

In further another embodiment of the metal material for electronic component according to the present invention, the underlayer (C layer) has an alloy composition comprising 50 mass % or more of the total of Ni, Cr, Mn, Fe, Co, Cu, and further comprising one or two or more selected from the group consisting of B, P, Sn, Zn.

In further another embodiment of the metal material for electronic component according to the present invention, when a depth analysis by XPS (X-ray photoelectron spectroscopy) is carried out, a position ($D_1$) where the atomic concentration (at %) of Sn or In of the surface layer (A layer) is a maximum value, a position ($D_2$) where the atomic concentration (at %) of Ag, Au, Pt, Pd, Ru, Rh, Os or Ir of the middle layer (B layer) is a maximum value and a position ($D_3$) where the atomic concentration (at %) of Ni, Cr, Mn, Fe, Co or Cu of the underlayer (C layer) is a maximum value are present in the order of $D_1$, $D_2$ and $D_3$ from the surface.

In further another embodiment of the metal material for electronic component according to the present invention, when a depth analysis by XPS (X-ray photoelectron spectroscopy) is carried out, the surface layer (A layer) has a maximum value of an atomic concentration (at %) of Sn or In of 10 at % or higher, and the middle layer (B layer) has a maximum value of an atomic concentration (at %) of Ag, Au, Pt, Pd, Ru, Rh, Os or Ir of 10 at % or higher; and a depth where the underlayer (C layer) has an atomic concentration (at %) of Ni, Cr, Mn, Fe, Co or Cu of 25% or higher is 50 nm or more.

In further another embodiment of the metal material for electronic component according to the present invention, the underlayer (C layer) has a thickness of 0.05 μm or larger.

In further another embodiment of the metal material for electronic component according to the present invention, the underlayer (C layer) has a deposition amount of Ni, Cr, Mn, Fe, Co, Cu of 0.03 mg/cm² or larger.

In further another embodiment of the metal material for electronic component according to the present invention, the underlayer (C layer) has a surface Vickers hardness of Hv300 or higher.

In further another embodiment of the metal material for electronic component according to the present invention, the surface Vickers hardness and the thickness of the underlayer (C layer) satisfy the following expression:

Vickers hardness ($Hv$)≥−376.22 Ln (thickness: μm)+ 86.411.

In further another embodiment of the metal material for electronic component according to the present invention, the underlayer (C layer) has a surface indentation hardness of 2,500 MPa or higher, the indentation hardness being a hardness acquired by measuring an impression made on the surface of the underlayer (C layer) by a load of 0.1 mN in an ultrafine hardness test.

In further another embodiment of the metal material for electronic component according to the present invention, the surface indentation hardness, which is a hardness acquired by measuring an impression made on the surface of the underlayer (C layer) by a load of 0.1 mN in an ultrafine hardness test, and the thickness of the underlayer (C layer) satisfy the following expression:

Indentation hardness (MPa)≥−3998.4 Ln (thickness: μm)+1178.9.

In further another embodiment of the metal material for electronic component according to the present invention, the underlayer (C layer) has a surface Vickers hardness of Hv1,000 or lower.

In further another embodiment of the metal material for electronic component according to the present invention, the underlayer (C layer) has a surface indentation hardness of 10,000 MPa or lower, the indentation hardness being a hardness acquired by measuring an impression made on the surface of the underlayer (C layer) by a load of 0.1 mN in an ultrafine hardness test.

In further another embodiment of the metal material for electronic component according to the present invention, the base material is a metal base material, and the metal base material has a surface Vickers hardness of Hv90 or higher.

In further another embodiment of the metal material for electronic component according to the present invention, the base material is a metal base material, and the metal base material has a surface indentation hardness of 1,000 MPa or higher, the indentation hardness being a hardness acquired by measuring an impression made on the surface of the metal base material by a load of 0.1 mN in an ultrafine hardness test.

In further another embodiment of the metal material for electronic component according to the present invention, the base material is a metal base material, and the metal base material has an elongation of 5% or higher, the elongation being measured by carrying out a tensile test at a tension rate of 50 mm/min in the rolling-parallel direction of the metal base material according to JIS C 6511.

In further another embodiment of the metal material for electronic component according to the present invention, the base material is a metal base material, and when a 90° bending test of the metal base material is carried out under the condition that the ratio of the thickness and the bending radius of the metal base material becomes 1 by using a letter-W-shape die, the metal base material has a minimum bending radius ratio (MBR/t) of 3 or lower, the minimum bending radius ratio being a minimum bending radius/the thickness of the metal base material at which no crack is generated in the metal base material.

In further another embodiment of the metal material for electronic component according to the present invention, when a depth analysis by XPS (X-ray photoelectron spectroscopy) is carried out, between a position ($D_1$) where the atomic concentration (at %) of Sn or In of the surface layer (A layer) is a maximum value and a position ($D_3$) where the atomic concentration (at %) of Ni, Cr, Mn, Fe, Co, Cu or Zn of the underlayer (C layer) is a maximum value, a region having 40 at % or more of Ag, Au, Pt, Pd, Ru, Rh, Os or Ir is present in a thickness of 1 nm or larger.

In further another embodiment of the metal material for electronic component according to the present invention, when an elemental analysis of the surface of the surface layer (A layer) is carried out by a survey measurement by XPS (X-ray photoelectron spectroscopy), the content of Sn, In is 2 at % or higher.

In further another embodiment of the metal material for electronic component according to the present invention, when an elemental analysis of the surface of the surface layer (A layer) is carried out by a survey measurement by XPS (X-ray photoelectron spectroscopy), the content of Ag, Au, Pt, Pd, Ru, Rh, Os or Ir is lower than 7 at %.

In further another embodiment of the metal material for electronic component according to the present invention, when an elemental analysis of the surface of the surface layer (A layer) is carried out by a survey measurement by XPS (X-ray photoelectron spectroscopy), the content of O is lower than 50 at %.

Further another aspect of the present invention is a connector terminal in which the metal material for electronic component according to the present invention is used for a contact portion.

Further another aspect of the present invention is a connector in which the connector terminal according to the present invention is used.

Further another aspect of the present invention is an FFC terminal in which the metal material for electronic component according to the present invention is used for a contact portion.

Further another aspect of the present invention is an FPC terminal in which the metal material for electronic component according to the present invention is used for a contact portion.

Further another aspect of the present invention is an FFC in which the FFC terminal according to the present invention is used.

Further another aspect of the present invention is an FPC in which the FPC terminal according to the present invention is used.

Further another aspect of the present invention is an electronic component in which the metal material for electronic component according to the present invention is used for an electrode for external connection.

Further another aspect of the present invention is a method for manufacturing the metal material for electronic component according to the present invention, the method comprising steps of forming the surface layer (A layer) and the middle layer (B layer) by surface treatments using wet plating, respectively.

In one embodiment of the method for manufacturing a metal material for electronic component according to the present invention, the wet plating is electroplating.

In another embodiment of the method for manufacturing a metal material for electronic component according to the present invention, the surface layer (A layer) is formed by a plating treatment using an acidic plating liquid.

In further another embodiment of the method for manufacturing a metal material for electronic component according to the present invention, the middle layer (B layer) is formed by a plating treatment using a cyanide-containing plating liquid.

In further another embodiment of the method for manufacturing a metal material for electronic component according to the present invention, the method comprises a step of forming the underlayer (C layer) by a plating treatment using a sulfamic acid bath or a Watts bath.

In further another embodiment of the method for manufacturing a metal material for electronic component according to the present invention, a plating liquid used in the sulfamic acid bath or the Watts bath is a bright Ni plating liquid.

In further another embodiment of the method for manufacturing a metal material for electronic component according to the present invention, a plating liquid to form the underlayer (C layer) contains saccharin as an additive.

Advantageous Effects of Invention

The present invention can provide a metal material for electronic component which has low insertability/extractability, low whisker formability and high durability, and a method for manufacturing the metal material.

DESCRIPTION OF EMBODIMENTS

Figure 1:
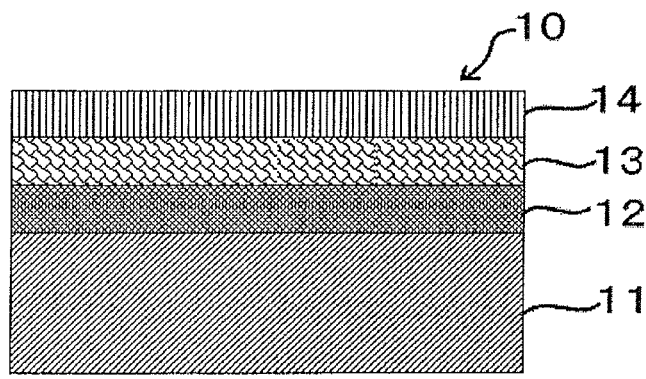
FIG. 1 is an illustrative diagram showing a constitution of a metal material for electronic component according to an embodiment of the present invention.

Hereinafter, the metal material for electronic component according to embodiments of the present invention will be described. As shown in FIG. 1, in a metal material 10 for electronic components according to the embodiment, an underlayer (C layer) 12 is formed on the surface of a base material 11; a middle layer (B layer) 13 is formed on the surface of the underlayer (C layer) 12; and an surface layer (A layer) 14 is formed on the surface of the middle layer (B layer) 13. The C layer is not essential in the present invention, and may not be formed.

Constitution of a Metal Material for Electronic Component (Base Material)

The base material 11 is not especially limited, but usable are metal base materials, for example, copper and copper alloys, Fe-based materials, stainless steels, titanium and titanium alloys, and aluminum and aluminum alloys. Metal base materials may be composited with resin layers. Examples of metal base materials composited with resin layers include electrode portions on FPC base materials or FFC base materials.

The Vickers hardness of the base material 11 is preferably Hv90 or higher. With the Vickers hardness of the base material 11 of Hv90 or higher, the thin film lubrication effect by the hard base material is improved and the inserting/extracting force is more reduced.

The indentation hardness of the base material 11 is preferably 1,000 MPa or higher. With the indentation hardness of the base material 11 of 1,000 MPa or higher, the thin film lubrication effect by the hard base material is improved and the inserting/extracting force is more reduced.

The elongation of the base material 11 is preferably 5% or higher. With the elongation of the base material 11 of 5% or higher, the bending workability is improved; and in the case where the metal material for electronic component according to the present invention is press-formed, cracks are hardly generated in the formed portion, and the decrease in the gas corrosion resistance (durability) is suppressed.

The minimum bending radius ratio (MBR/t) of the base material 11 is preferably 3 or lower. With the minimum bending radius ratio (MBR/t) of the base material 11 of 3 or lower, the bending workability is improved; and in the case where the metal material for electronic component according to the present invention is press-formed, cracks are hardly generated in the formed portion, and the decrease in the gas corrosion resistance (durability) is suppressed.

(Surface Layer (A Layer))

The surface layer (A layer) 14 needs to be Sn, In or an alloy thereof. Sn and In, though being oxidative metals, have a feature of being relatively soft among metals. Therefore, even if an oxide film is formed on the Sn and In surface, for example, when the metal material for electronic component is used as a contact material for engaging a male terminal and a female terminal, since the oxide film is easily shaven to thereby make the contact of metals, a low contact resistance can be provided.

Sn and In are excellent in the gas corrosion resistance to gases such as chlorine gas, sulfurous acid gas and hydrogen sulfide gas; and for example, in the case where Ag, inferior in the gas corrosion resistance, is used for the middle layer (B layer) 13; Ni, inferior in the gas corrosion resistance, is used for the underlayer (C layer) 12; and copper and a copper alloy, inferior in the gas corrosion resistance, is used for the base material 11, Sn and In have a function of improving the gas corrosion resistance of the metal material for electronic component. Here, among Sn and In, Sn is preferable because In is under a strict regulation based on the technical guideline regarding the health hazard prevention of Ministry of Health, Labor and Welfare.

The composition of the surface layer (A layer) comprises 50 mass % or more of Sn, In or the total of Sn and In, and the other alloy component(s) may be constituted of one or two or more elements selected from the group consisting of Ag, As, Au, Bi, Cd, Co, Cr, Cu, Fe, Mn, Mo, Ni, Pb, Sb, W, Zn. The surface layer (A layer) 14 is formed, for example, of an Sn—Ag plating to thereby make the composition an alloy; thereby, the composition more improves low insertability/extractability, low whisker formability, durability (heat resistance, gas corrosion resistance, solder wettability and the like) and the like in some cases.

The thickness of the surface layer (A layer) 14 needs to be 0.002 to 0.2 µm. The thickness of the surface layer (A layer) 14 is preferably 0.01 to 0.1 µm. With the thickness of the surface layer (A layer) 14 of smaller than 0.002 µm, a sufficient gas corrosion resistance cannot be provided; and when the metal material for electronic component is subjected to a gas corrosion test using chlorine gas, sulfurous acid gas, hydrogen sulfide gas or the like, the metal material is corroded to thereby largely increase the contact resistance as compared with before the gas corrosion test. In order to provide a more sufficient gas corrosion resistance, the thickness is preferably 0.01 µm or larger. If the thickness becomes large, the adhesive wear of Sn and In becomes much; the inserting/extracting force becomes high; and the whiskers are liable to be generated. In order to provide more sufficiently low insertability/extractability and low whisker formability, the thickness is made to be 0.2 µm or smaller, and is more preferably 0.1 µm or smaller. If the thickness is made to be 0.1 µm or smaller, no whisker is generated. Whiskers are generated by generation of screw dislocation, but a bulk of a thickness of several hundred nanometers or larger is needed in order to generate the screw dislocation. With the thickness of the surface layer (A layer) 14 of 0.2 µm or smaller, the thickness is not a thickness enough to generate screw dislocation, and no whisker is basically generated. Since short circuit diffusion easily progresses at normal temperature between the surface layer (A layer) and the middle layer (B layer) and easily forms an alloy, no whisker is generated.

The deposition amount of Sn, In of the surface layer (A layer) 14 needs to be 1 to 150 µg/cm². The deposition amount of Sn, In of the surface layer (A layer) 14 is preferably 7 to 75 µg/cm². Here, the reason to define the deposition amount will be described. For example, in some cases of measuring the thickness of the surface layer (A layer) 14 by an X-ray fluorescent film thickness meter, due to an alloy layer formed between the surface layer (A layer) and the middle layer (B layer), an error is produced in the value of the measured thickness. By contrast, the case of the control using the deposition amount can carry out more exact quality control, not influenced by the formation situation of the alloy layer. With the deposition amount of Sn, In of the surface layer (A layer) 14 of smaller than 1 µg/cm², a sufficient gas corrosion resistance cannot be provided; and the metal material for electronic component is subjected to a gas corrosion test using chlorine gas, sulfurous acid gas, hydrogen sulfide gas or the like, the metal material is corroded to thereby largely increase the contact resistance as compared with before the gas corrosion test. In order to provide a more sufficient gas corrosion resistance, the deposition amount is preferably 7 µg/cm² or larger. If the deposition amount becomes large, the adhesive wear of Sn and In becomes much; the inserting/extracting force becomes high; and the whiskers are liable to be generated. In order to provide more sufficiently low insertability/extractability and low whisker formability, the deposition amount is made to be 150 µg/cm² or smaller, and is more preferably 75 µg/cm² or smaller. If the deposition amount is made to be 75 µg/cm² or smaller, no whisker is generated. Whiskers are generated by generation of screw dislocation, but a bulk of a deposition amount of several hundred µg/cm² or larger is needed in order to generate the screw dislocation. With the deposition amount of the surface layer (A layer) 14 of 150 µg/cm² or smaller, the deposition amount is not a deposition amount enough to generate screw dislocation, and no whisker is basically generated. Since short circuit diffusion easily progresses at normal temperature between the surface layer (A layer) and the middle layer (B layer), and easily forms an alloy, no whisker is generated.

(Middle Layer (B Layer))

The middle layer (B layer) 13 needs to be formed of Ag, Au, Pt, Pd, Ru, Rh, Os, Ir, or an alloy thereof. Ag, Au, Pt, Pd, Ru, Rh, Os, Ir, have a feature of relatively having a heat resistance among metals. Therefore, the middle layer (B layer) suppresses the diffusion of the compositions of the base material 11 and the underlayer (C layer) 12 to the surface layer (A layer) 14 side, and improves the heat resistance. These metals form compounds with Sn and In of the surface layer (A layer) 14 and suppress the oxide film formation of Sn and In, and improve the solder wettability. Among Ag, Au, Pt, Pd, Ru, Rh, Os and Ir, Ag is more desirable from the viewpoint of the conductivity. Ag has a high conductivity. For example, in the case of using Ag for applications of high-frequency signals, the skin effect reduces the impedance resistance.

The alloy composition of the middle layer (B layer) 13 comprises 50 mass % or more of Ag, Au, Pt, Pd, Ru, Rh, Os, Ir, or the total of Ag, Au, Pt, Pd, Ru, Rh, Os and Ir, and the other alloy component(s) may be constituted of one or two or more elements selected from the group consisting of Bi, Cd, Co, Cu, Fe, In, Mn, Mo, Ni, Pb, Sb, Se, Sn, W, Tl, Zn. The middle layer (B layer) 13 is formed, for example, of an Sn—Ag plating to thereby make the composition an alloy; thereby, the composition improves low insertability/extractability, low whisker formability, durability (heat resistance, gas corrosion resistance, solder wettability and the like) and the like in some cases.

The thickness of the middle layer (B layer) 13 needs to be 0.001 to 0.3 µm. The thickness of the middle layer (B layer) 13 is preferably 0.005 to 0.1 µm. With the thickness of smaller than 0.001 µm, the base material 11 or the underlayer (C layer) 12 and the surface layer (A layer) form an alloy, and the contact resistance and solder wettability after a heat resistance test become worsened. In order to provide more sufficient heat resistance and solder wettability, the thickness is preferably 0.005 µm or larger. If the thickness becomes large, since the thin film lubrication effect by the hard base material 11 or the underlayer (C layer) 12 is reduced and the inserting/extracting force becomes high, the thickness is 0.3 µm or smaller, and more preferably 0.1 µm or smaller, in order to provide a more sufficiently low insertability/extractability.

The deposition amount of Ag, Au, Pt, Pd, Ru, Rh, Os, Ir, or an alloy thereof of the middle layer (B layer) 13 needs to be 1 to 330 µg/cm². The deposition amount of the middle layer (B layer) 13 is preferably 4 to 120 μg/cm². Here, the reason to define the deposition amount will be described. For example, in some cases of measuring the thickness of the middle layer (B layer) 13 by an X-ray fluorescent film thickness meter, due to an alloy layer formed between the surface layer (A layer) 14 and the middle layer (B layer) 13, an error is produced in the value of the measured thickness. By contrast, the case of the control using the deposition amount can carry out more exact quality control, not influenced by the formation situation of the alloy layer. With the deposition amount of smaller than 1 μg/cm², the base material 11 or the underlayer (C layer) 12 and the surface layer (A layer) form an alloy, and the contact resistance and solder wettability after a heat resistance test become worsened. In order to provide more sufficient heat resistance and solder wettability, the deposition amount is preferably 4 μg/cm² or larger. If the deposition amount is large, since the thin film lubrication effect by the hard base material 11 or the underlayer (C layer) is reduced and the inserting/extracting force largely increases, the deposition amount is 330 μg/cm² or smaller, and more preferably 120 μg/cm² or smaller, in order to provide a more sufficiently low insertability/extractability.

(Underlayer (C Layer))

Between the base material 11 and the middle layer (B layer) 13, the underlayer (C layer) 12 comprising one or two or more selected from the group consisting of Ni, Cr, Mn, Fe, Co, Cu is preferably formed. By forming the underlayer (C layer) 12 by using one or two or more elements selected from the group consisting of Ni, Cr, Mn, Fe, Co, Cu, the thin film lubrication effect is improved due to the formation of the hard underlayer (C layer) to thereby improve low insertability/extractability; and the underlayer (C layer) 12 prevents the diffusion of constituting metals of the base material 11 to the middle layer (B layer) to thereby improve the durability including the suppression of the increase in the contact resistance and the deterioration of the solder wettability after the heat resistance test and the gas corrosion resistance test.

The alloy composition of the underlayer (C layer) 12 comprises 50 mass % or more of the total of Ni, Cr, Mn, Fe, Co, Cu, and may further comprise one or two or more selected from the group consisting of B, P, Sn, Zn. By making the alloy composition of the underlayer (C layer) 12 to have such a constitution, the underlayer (C layer) is further hardened to thereby further improve the thin film lubrication effect to improve low insertability/extractability; and the alloying of the underlayer (C layer) 12 further prevents the diffusion of constituting metals of the base material 11 to the middle layer (B layer) to thereby improve the durability including the suppression of the increase in the contact resistance and the deterioration of the solder wettability after the heat resistance test and the gas corrosion resistance test.

The thickness of the underlayer (C layer) 12 is preferably 0.05 μm or larger. With the thickness of the underlayer (C layer) 12 of smaller than 0.05 μm, the thin film lubrication effect by the hard underlayer (C layer) decreases to thereby worsen the low insertability/extractability; and the constituting metals of the base material 11 become liable to diffuse to the middle layer (B layer) to thereby worsen the durability including the easy increase in the contact resistance and the easy deterioration of the solder wettability after the heat resistance test and the gas corrosion resistance test.

The deposition amount of Ni, Cr, Mn, Fe, Co, Cu of the underlayer (C layer) 12 is preferably 0.03 mg/cm² or larger. Here, the reason to define the deposition amount will be described. For example, in some cases of measuring the thickness of the underlayer (C layer) 12 by an X-ray fluorescent film thickness meter, due to alloy layers formed with the surface layer (A layer) 14, the middle layer (B layer) 13, the base material 11 and the like, an error is produced in the value of the measured thickness. By contrast, the case of the control using the deposition amount can carry out more exact quality control, not influenced by the formation situation of the alloy layer. With the deposition amount of smaller than 0.03 mg/cm², the thin film lubrication effect by the hard underlayer (C layer) decreases to thereby worsen the low insertability/extractability; and the constituting metals of the base material 11 become liable to diffuse to the middle layer (B layer) to thereby worsen the durability including the easy increase in the contact resistance and the easy deterioration of the solder wettability after the heat resistance test and the gas corrosion resistance test.

(Heat Treatment)

After the surface layer (A layer) 14 is formed, for the purpose of improving low insertability/extractability, low whisker formability and durability (heat resistance, gas corrosion resistance, solder wettability and the like), a heat treatment may be carried out. The heat treatment makes it easy for the surface layer (A layer) 14 and the middle layer (B layer) 13 to form an alloy layer and makes the adhesion of Sn lower to thereby provide low insertability/extractability, and to thereby further improve the low whisker formability and the durability. Here, the treatment condition (temperature×time) of the heat treatment can suitably be selected. Here, the heat treatment may not particularly be carried out.

(Post-Treatment)

On the surface layer (A layer) 14 or after the heat treatment is carried out on the surface layer (A layer) 14, for the purpose of improving the low insertability/extractability and the durability (heat resistance, gas corrosion resistance, solder wettability and the like), a post-treatment may be carried out. The post-treatment improves the lubricity, provides further low insertability/extractability, and suppresses the oxidation of the surface layer (A layer) and the middle layer (B layer), to thereby improve the durability such as heat resistance, gas corrosion resistance, and solder wettability. The post-treatment specifically includes a phosphate salt treatment, a lubrication treatment and a silane coupling treatment, using inhibitors. Here, the treatment condition (temperature×time) of the heat treatment can suitably be selected. Then, the heat treatment may not particularly be carried out.

Properties of the Metal Material for Electronic Component

The surface Vickers hardness (as measured from the surface of the surface layer) of the surface layer (A layer) is preferably Hv300 or higher. With the surface Vickers hardness of the surface layer (A layer) 14 of Hv300 or higher, the hard surface layer (A layer) improves the thin film lubrication effect and improves the low insertability/extractability. By contrast, the surface Vickers hardness (as measured from the surface of the surface layer) of the surface layer (A layer) 14 is preferably Hv1,000 or lower. With the surface Vickers hardness of the surface layer (A layer) 14 of Hv1,000 or lower, the bending workability is improved; and in the case where the metal material for electronic component according to the present invention is press-formed, cracks are hardly generated in the formed portion, and the decrease in the gas corrosion resistance (durability) is suppressed.

The surface indentation hardness (as measured from the surface of the surface layer) of the surface layer (A layer) 14 is preferably 2,500 MPa or higher. With the surface indentation hardness of the surface layer (A layer) 14 of 2,500 MPa or higher, the hard surface layer (A layer) improves the thin film lubrication effect and improves the low insertability/extractability. By contrast, the surface indentation hardness (as measured from the surface of the surface layer) of the surface layer (A layer) 14 is preferably 10,000 MPa or lower. With the surface indentation hardness of the surface layer (A layer) 14 of 10,000 MPa or lower, the bending workability is improved; and in the case where the metal material for electronic component according to the present invention is press-formed, cracks are hardly generated in the formed portion, and the decrease in the gas corrosion resistance (durability) is suppressed.

The arithmetic mean deviation (Ra) of the surface of the surface layer (A layer) 14 is preferably 0.1 µm or lower. With the arithmetic mean deviation (Ra) of the surface of the surface layer (A layer) 14 of 0.1 µm or lower, since convex portions, which are relatively easily corroded, become few and the surface becomes smooth, the gas corrosion resistance is improved.

The maximum height (Rz) of the surface of the surface layer (A layer) 14 is preferably 1 µm or lower. With the maximum height (Rz) of the surface of the surface layer (A layer) 14 of 1 µm or lower, since convex portions, which are relatively easily corroded, become few and the surface becomes smooth, the gas corrosion resistance is improved.

The surface reflection density of the surface layer (A layer) 14 is preferably 0.3 or higher. With the surface reflection density of the surface layer (A layer) 14 of 0.3 or higher, since convex portions, which are relatively easily corroded, become few and the surface becomes smooth, the gas corrosion resistance is improved.

The Vickers hardness of the underlayer (C layer) 12 is preferably Hv300 or higher. With the Vickers hardness of the underlayer (C layer) 12 of Hv300 or higher, the underlayer (C layer) is further hardened to thereby further improve the thin film lubrication effect to improve the low insertability/extractability. By contrast, the Vickers hardness of the underlayer (C layer) 12 is preferably Hv1,000 or lower. With the Vickers hardness of the underlayer (C layer) 12 of Hv1,000 or lower, the bending workability is improved; and in the case where the metal material for electronic component according to the present invention is press-formed, cracks are hardly generated in the formed portion, and the decrease in the gas corrosion resistance (durability) is suppressed.

The Vickers hardness of the underlayer (C layer) 12 and the thickness of the underlayer (C layer) 12 preferably satisfy the following expression:

$$\text{Vickers hardness }(Hv) \geq -376.22 \text{ Ln (thickness: µm)} + 86.411.$$

If the Vickers hardness of the underlayer (C layer) 12 and the thickness of the underlayer (C layer) 12 satisfy the above expression, the underlayer (C layer) is further hardened to thereby further improve the thin film lubrication effect to improve the low insertability/extractability.

Here, in the present invention, "Ln (thickness: µm)" refers to a numerical value of a natural logarithm of a thickness (µm).

The indentation hardness of the underlayer (C layer) 12 is preferably 2,500 MPa or higher. With the indentation hardness of the underlayer (C layer) 12 of 2,500 MPa or higher, the underlayer (C layer) is further hardened to thereby further improve the thin film lubrication effect to improve the low insertability/extractability. By contrast, the indentation hardness of the underlayer (C layer) 12 is preferably 10,000 MPa or lower. With the indentation hardness of the underlayer (C layer) 12 of 10,000 MPa or lower, the bending workability is improved; and in the case where the metal material for electronic component according to the present invention is press-formed, cracks are hardly generated in the formed portion, and the decrease in the gas corrosion resistance (durability) is suppressed.

The indentation hardness of the underlayer (C layer) 12 and the thickness of the underlayer (C layer) 12 preferably satisfy the following expression:

$$\text{Indentation hardness (MPa)} \geq -3998.4 \text{ Ln (thickness: µm)} + 1178.9.$$

If the indentation hardness of the underlayer (C layer) 12 and the thickness of the underlayer (C layer) 12 satisfy the above expression, the underlayer (C layer) is further hardened to thereby further improve the thin film lubrication effect to improve the low insertability/extractability.

When a depth analysis by XPS (X-ray photoelectron spectroscopy) is carried out, it is preferable that a position ($D_1$) where the atomic concentration (at %) of Sn or In of the surface layer (A layer) 14 is a maximum value and a position ($D_2$) where the atomic concentration (at %) of Ag, Au, Pt, Pd, Ru, Rh, Os or Ir of the middle layer (B layer) 13 is a maximum value are present in the order of $D_1$ and $D_2$ from the surface. If the positions are not present in the order of $D_1$ and $D_2$ from the surface, there arises a risk that: a sufficient gas corrosion resistance cannot be provided; and when the metal material for electronic component is subjected to a gas corrosion test using chlorine gas, sulfurous acid gas, hydrogen sulfide gas or the like, the metal material is corroded to thereby largely increase the contact resistance as compared with before the gas corrosion test.

When a depth analysis by XPS (X-ray photoelectron spectroscopy) is carried out, it is preferable that the surface layer (A layer) has a maximum value of an atomic concentration (at %) of Sn or In of 10 at % or higher. In the case where the maximum value of the atomic concentration (at %) of Sn or In of the surface layer (A layer) 14 is lower than 10 at %, there arises a risk that: a sufficient gas corrosion resistance cannot be provided; and when the metal material for electronic component is subjected to a gas corrosion test using chlorine gas, sulfurous acid gas, hydrogen sulfide gas or the like, the metal material is corroded to thereby largely increase the contact resistance as compared with before the gas corrosion test.

When a depth analysis by XPS (X-ray photoelectron spectroscopy) is carried out, it is preferable that the middle layer (B layer) has a maximum value of an atomic concentration (at %) of Ag, Au, Pt, Pd, Ru, Rh, Os or Ir of 10 at % or higher. In the case where the maximum value of the atomic concentration (at %) of Ag, Au, Pt, Pd, Ru, Rh, Os or Ir of the middle layer (B layer) 13 is lower than 10 at %, there arises a risk that the base material 11 or the underlayer (C layer) 12 and the surface layer (A layer) form an alloy, and the contact resistance and solder wettability after a heat resistance test become worsened.

When a depth analysis by XPS (X-ray photoelectron spectroscopy) is carried out, it is preferable that a position ($D_1$) where the atomic concentration (at %) of Sn or In of the surface layer (A layer) 14 is a maximum value, a position ($D_2$) where the atomic concentration (at %) of Ag, Au, Pt, Pd, Ru, Rh, Os or Ir of the middle layer (B layer) 13 is a maximum value and a position ($D_3$) where the atomic concentration (at %) of Ni, Cr, Mn, Fe, Co or Cu of the underlayer (C layer) 12 is a maximum value are present in the order of $D_1$ and $D_2$ and $D_3$ from the surface. If the positions are not present in the order of $D_1$, $D_2$ and $D_3$ from the surface, there arises a risk that: a sufficient gas corrosion resistance cannot be provided; and when the metal material for electronic component is subjected to a gas corrosion test using chlorine gas, sulfurous acid gas, hydrogen sulfide gas or the like, the metal material is corroded to thereby largely increase the contact resistance as compared with before the gas corrosion test.

When a depth analysis by XPS (X-ray photoelectron spectroscopy) is carried out, it is preferable that: the surface layer (A layer) has a maximum value of an atomic concentration (at %) of Sn or In of 10 at % or higher, and the middle layer (B layer) has a maximum value of an atomic concentration (at %) of Ag, Au, Pt, Pd, Ru, Rh, Os or Ir of 10 at % or higher; and a depth where the atomic concentration (at %) of Ni, Cr, Mn, Fe, Co or Cu of the underlayer (C layer) 12 is 25 at % or higher is 50 nm or more. In the case where the maximum value of the atomic concentration (at %) of Sn or In of the surface layer (A layer) 14, and the maximum value of the atomic concentration (at %) of Ag, Au, Pt, Pd, Ru, Rh, Os or Ir of the middle layer (B layer) 13 are each lower than 10 at %; and where a depth where the atomic concentration (at %) of Ni, Cr, Mn, Fe, Co or Cu of the underlayer (C layer) 12 is 25 at % or higher is shallower than 50 nm, there arises a risk that the base material components diffuse to the surface layer (A layer) 14 or the middle layer (B layer) 13 to thereby worsen the low insertability/extractability and the durability (heat resistance, gas corrosion resistance, solder wettability and the like).

When a depth analysis by XPS (X-ray photoelectron spectroscopy) is carried out, it is preferable that between a position ($D_1$) where the atomic concentration (at %) of Sn or In of the surface layer (A layer) 14 is a maximum value and a position ($D_3$) where the atomic concentration (at %) of Ni, Cr, Mn, Fe, Co, Cu or Zn of the underlayer (C layer) 12 is a maximum value, a region having 40 at % or more of Ag, Au, Pt, Pd, Ru, Rh, Os or Ir is present in a thickness of 1 nm or larger. If the region is present in a thickness of smaller than 1 nm, for example, in the case of Ag, there arises a risk of worsening the solder wettability and the heat resistance.

When an elemental analysis of the surface of the surface layer (A layer) is carried out by a survey measurement by XPS (X-ray photoelectron spectroscopy), it is preferable that the content of Sn, In is 1 at % or higher. If the content of Sn, In is lower than 2 at %, for example, in the case of Ag, there arises a risk that the sulfurization resistance is inferior and the contact resistance largely increases. For example, in the case of Pd, there arises a risk that Pd is oxidized to thereby raise the contact resistance.

When an elemental analysis of the surface of the surface layer (A layer) is carried out by a survey measurement by XPS (X-ray photoelectron spectroscopy), it is preferable that the content of Ag, Au, Pt, Pd, Ru, Rh, Os or Ir is lower than 7 at %. If the content of Ag, Au, Pt, Pd, Ru, Rh, Os or Ir is 7 at % or higher, for example, in the case of Ag, there arises a risk that the sulfurization resistance is inferior and the contact resistance largely increases. For example, in the case of Pd, there arises a risk that Pd is oxidized to thereby raise the contact resistance.

When an elemental analysis of the surface of the surface layer (A layer) is carried out by a survey measurement by XPS (X-ray photoelectron spectroscopy), it is preferable that the content of O is lower than 50 at %. If the content of O is 50 at % or higher, there arises a risk of raising the contact resistance.

Applications of the Metal Material for Electronic Component

The applications of the metal material for electronic component according to the present invention are not especially limited, but examples thereof include connector terminals using the metal material for electronic component for contact portions, FFC terminals or FPC terminals using the metal material for electronic component for contact portions, and electronic components using the metal material for electronic component for electrodes for external connection. Here, the terminals are not limited by methods of being joined with the wiring side, including solderless terminals, soldering terminals and press-fit terminals. The electrodes for external connection include connection components in which tabs are surface-treated, and materials which are surface-treated for underbump metals of semiconductors.

Further, connectors may be fabricated by using the connector terminals thus formed; and FFCs or FPCs may be fabricated by using the FFC terminals or the FPC terminals.

Both of a male terminal and a female terminal of the connector may be of the metal material for electronic component according to the present invention, and only one of a male terminal and a female terminal thereof may be of the metal material. By using the metal material for electronic component according to the present invention for both of the male terminal and the female terminal, the low insertability/extractability is further improved.

A Method for Manufacturing the Metal Material for Electronic Component

A method for manufacturing the metal material for electronic component according to the present invention uses wet (electro-, electroless) plating, dry (sputtering, ion plating or the like) plating, or the like.

However, the wet plating more suppresses the generation in a plating film of whiskers due to codeposition of infinitesimal amounts of impurity components present in a plating liquid, and more improves the low insertability/extractability due to the electrodeposition texture becoming hard, than the dry plating in some cases. The wet plating is preferable from the viewpoint of the manufacture cost.

In the wet plating, electroplating is preferable. The electroplating, since forming a more uniform film than electroless plating, improves the durability (heat resistance, gas corrosion resistance, solder wettability and the like) in some cases.

The surface layer (A layer) 14 is preferably formed by a plating treatment using an acidic plating liquid. The use of an acidic plating liquid improves the adherence with the middle layer (B layer) 13.

The middle layer (B layer) 13 is preferably formed by a plating treatment using a cyanide-containing plating liquid. The use of a cyanide-containing plating liquid forms a dense film, and improves the durability (heat resistance, gas corrosion resistance, solder wettability and the like).

The underlayer (C layer) 12 is preferably formed by a plating treatment using a sulfamic acid bath or a Watts bath. The use of a sulfamic acid bath or a Watts bath improves the adherence with the base material.

A plating liquid used in a sulfamic acid bath or a Watts bath is preferably a bright Ni plating liquid. The use of a bright Ni plating liquid as the plating liquid makes a film smooth and hard, and improves the low insertability/extractability and the durability (heat resistance, gas corrosion resistance, solder wettability and the like).

The sulfamic acid bath or the Watts bath preferably contains saccharin as an additive. The addition of saccharin makes the film dense and hard, and the film smooth and hard to thereby improve the low insertability/extractability and the durability (heat resistance, gas corrosion resistance, solder wettability and the like).

Examples

Hereinafter, although Examples of the present invention will be described with Comparative Examples, these are provided to better understand the present invention, and are not intended to limit the present invention.

As Examples and Comparative Examples, samples to be formed by providing a base material, an underlayer (C layer), a middle layer (B layer) and a surface layer (A layer) in this order, and heat-treating the resultant, were fabricated under the conditions shown in the following Tables 1 to 7, respectively. Also examples in which no underlayer (C layer) was formed were fabricated.

The fabrication condition of base materials is shown in Table 1; the fabrication condition of underlayers (C layers) is shown in Table 2; the fabrication condition of middle layers (B layers) is shown in Table 3; the fabrication condition of surface layers (A layers) is shown in Table 4; and the heat-treatment condition is shown in Table 5. Further, the fabrication conditions and the heat-treatment conditions of the each layer used in each Example are shown in Table 6 (Table 6-1, Table 6-2, Table 6-3); and the fabrication conditions and the heat-treatment conditions of the each layer used in each Comparative Example are shown in Table 7.

TABLE 1

| No. | Shape | Thickness [mm] | Width [mm] | Component [mass %] | Classification by Quality |
|---|---|---|---|---|---|
| 1 | Plate | 0.30 | 30 | Cu—30Zn | 1/4H |
|   | Male terminal | 0.64 | 2.3 | | |
| 2 | Plate | 0.30 | 30 | Cu—30Zn | H |
|   | Male terminal | 0.64 | 2.3 | | |
| 3 | Plate | 0.30 | 30 | Cu—10Sn—0.15P | EH |
|   | Male terminal | 0.64 | 2.3 | | |
| 4 | Plate | 0.30 | 30 | Cu—3Ti | SH |
|   | Male terminal | 0.64 | 2.3 | | |

TABLE 2

| No. | Surface Treatment Method | Detail |
|---|---|---|
| 1 | Electroplating | Plating liquid: Ni sulfamate plating liquid<br>Plating temperature: 55° C.<br>Current density: 0.5 to 4 A/dm$^2$ |
| 2 | Electroplating | Plating liquid: Cu sulfate plating liquid<br>Plating temperature: 30° C.<br>Current density: 2.3 A/dm$^2$ |
| 3 | Electroplating | Plating liquid: chromium sulfate liquid<br>Plating temperature: 30° C.<br>Current density: 4 A/dm$^2$ |
| 4 | Sputtering | Target: having a predetermined composition<br>Apparatus: sputtering apparatus made by Ulvac, Inc.<br>Output: DC 50 W<br>Argon pressure: 0.2 Pa |
| 5 | Electroplating | Plating liquid: Fe sulfate liquid<br>Plating temperature: 30° C.<br>Current density: 4 A/dm$^2$ |
| 6 | Electroplating | Plating liquid: Co sulfate bath<br>Plating temperature: 30° C.<br>Current density: 4 A/dm$^2$ |
| 7 | Electroplating | Plating liquid: Ni sulfamate plating liquid + saccharin<br>Plating temperature: 55° C.<br>Current density: 4 A/dm$^2$ |
| 8 | Electroplating | Plating liquid: Ni sulfamate plating liquid + saccharin + additive<br>Plating temperature: 55° C.<br>Current density: 4 A/dm$^2$ |

TABLE 3

| No. | Surface Treatment Method | Detail |
|---|---|---|
| 1 | Electroplating | Plating liquid: Ag cyanide plating liquid<br>Plating temperature: 40° C.<br>Current density: 0.2 to 4 A/dm$^2$ |
| 2 | Electroplating | Plating liquid: Au cyanide plating liquid<br>Plating temperature: 40° C.<br>Current density: 0.2 to 4 A/dm$^2$ |
| 3 | Electroplating | Plating liquid: chloroplatinic acid plating liquid<br>Plating temperature: 40° C.<br>Current density: 0.2 to 4 A/dm$^2$ |
| 4 | Electroplating | Plating liquid: diammine palladium(II) chloride plating liquid<br>Plating temperature: 40° C.<br>Current density: 0.2 to 4 A/dm$^2$ |
| 5 | Electroplating | Plating liquid: Ru sulfate plating liquid<br>Plating temperature: 40° C.<br>Current density: 0.2 to 4 A/dm$^2$ |
| 6 | Sputtering | Target: having a predetermined composition<br>Apparatus: sputtering apparatus made by Ulvac, Inc.<br>Output: DC 50 W<br>Argon pressure: 0.2 Pa |
| 7 | Electroplating | Plating liquid: Sn methanesulfonate plating liquid<br>Plating temperature: 40° C.<br>Current density: 0.2 to 4 A/dm$^2$ |
| 8 | Electroplating | Plating liquid: Cu sulfate plating liquid<br>Plating temperature: 30° C.<br>Current density: 2.3 A/dm$^2$ |

TABLE 4

| No. | Surface Treatment Method | Detail |
|---|---|---|
| 1 | Electroplating | Plating liquid: Sn methanesulfonate plating liquid<br>Plating temperature: 40° C.<br>Current density: 0.2 to 4 A/dm$^2$ |
| 2 | Sputtering | Target: having a predetermined composition<br>Apparatus: sputtering apparatus made by Ulvac, Inc.<br>Output: DC 50 W<br>Argon pressure: 0.2 Pa |
| 3 | Electroplating | Plating liquid: Ag cyanide plating liquid<br>Plating temperature: 40° C.<br>Current density: 0.2 to 4 A/dm$^2$ |

TABLE 5

| No. | Temperature [° C.] | Time [sec] |
|---|---|---|
| 1 | 300 | 5 |
| 2 | 300 | 20 |

TABLE 6-1

| Example No. | Surface Layer (A Layer) Condition No. (see Table 4) | Middle Layer (B Layer) Condition No. (see Table 3) | Underlayer (C Layer) Condition No. (see Table 2) | Heat Treatment Condition No. (see Table 5) | Material No. (see Table 1) |
|---|---|---|---|---|---|
| 1 | 1 | 1 | — | — | 1 |
| 2 | 1 | 1 | — | — | 1 |
| 3 | 1 | 1 | — | — | 1 |
| 4 | 1 | 1 | — | — | 1 |
| 5 | 1 | 1 | — | — | 1 |
| 6 | 1 | 1 | — | — | 1 |
| 7 | 2 | 1 | — | — | 1 |
| 8 | 2 | 1 | — | — | 1 |
| 9 | 2 | 1 | — | — | 1 |
| 10 | 2 | 1 | — | — | 1 |
| 11 | 2 | 1 | — | — | 1 |
| 12 | 2 | 1 | — | — | 1 |
| 13 | 2 | 1 | — | — | 1 |
| 14 | 2 | 1 | — | — | 1 |
| 15 | 2 | 1 | — | — | 1 |
| 16 | 2 | 1 | — | — | 1 |
| 17 | 2 | 1 | — | — | 1 |
| 18 | 2 | 1 | — | — | 1 |
| 19 | 2 | 1 | — | — | 1 |
| 20 | 2 | 1 | — | — | 1 |
| 21 | 2 | 1 | — | — | 1 |
| 22 | 2 | 1 | — | — | 1 |
| 23 | 2 | 1 | — | — | 1 |
| 24 | 2 | 1 | — | — | 1 |
| 25 | 1 | 2 | — | — | 1 |
| 26 | 1 | 3 | — | — | 1 |
| 27 | 1 | 4 | — | — | 1 |
| 28 | 1 | 5 | — | — | 1 |
| 29 | 1 | 6 | — | — | 1 |
| 30 | 1 | 6 | — | — | 1 |

TABLE 6-2

| Example No. | Surface Layer (A Layer) Condition No. (see Table 4) | Middle Layer (B Layer) Condition No. (see Table 3) | Underlayer (C Layer) Condition No. (see Table 2) | Heat Treatment Condition No. (see Table 5) | Material No. (see Table 1) |
|---|---|---|---|---|---|
| 31 | 1 | 6 | — | — | 1 |
| 32 | 1 | 6 | — | — | 1 |
| 33 | 1 | 6 | — | — | 1 |
| 34 | 1 | 6 | — | — | 1 |
| 35 | 1 | 6 | — | — | 1 |
| 36 | 1 | 6 | — | — | 1 |
| 37 | 1 | 6 | — | — | 1 |
| 38 | 1 | 6 | — | — | 1 |
| 39 | 1 | 6 | — | — | 1 |
| 40 | 1 | 6 | — | — | 1 |
| 41 | 1 | 6 | — | — | 1 |
| 42 | 1 | 6 | — | — | 1 |
| 43 | 1 | 6 | — | — | 1 |
| 44 | 1 | 6 | — | — | 1 |
| 45 | 1 | 6 | — | — | 1 |
| 46 | 1 | 6 | — | — | 1 |
| 47 | 1 | 6 | — | — | 1 |
| 48 | 1 | 6 | — | — | 1 |
| 49 | 1 | 6 | — | — | 1 |
| 50 | 1 | 6 | — | — | 1 |
| 51 | 1 | 6 | — | — | 1 |
| 52 | 1 | 6 | — | — | 1 |
| 53 | 1 | 6 | — | — | 1 |
| 54 | 1 | 1 | — | — | 2 |
| 55 | 1 | 1 | — | — | 3 |
| 56 | 1 | 1 | — | — | 4 |
| 57 | 1 | 1 | — | — | 2 |
| 58 | 1 | 1 | — | — | 2 |
| 59 | 1 | 1 | — | — | 2 |
| 60 | 1 | 1 | — | — | 2 |

TABLE 6-3

| Example No. | Surface Layer (A Layer) Condition No. (see Table 4) | Middle Layer (B Layer) Condition No. (see Table 3) | Underlayer (C Layer) Condition No. (see Table 2) | Heat Treatment Condition No. (see Table 5) | Material No. (see Table 1) |
|---|---|---|---|---|---|
| 61 | 1 | 1 | 1 | — | 2 |
| 62 | 1 | 1 | 1 | — | 2 |
| 63 | 1 | 1 | 3 | — | 2 |
| 64 | 1 | 1 | 4 | — | 2 |
| 65 | 1 | 1 | 5 | — | 2 |
| 66 | 1 | 1 | 6 | — | 2 |
| 67 | 1 | 1 | 2 | — | 2 |
| 68 | 1 | 1 | 4 | — | 2 |
| 69 | 1 | 1 | 4 | — | 2 |
| 70 | 1 | 1 | 4 | — | 2 |
| 71 | 1 | 1 | 4 | — | 2 |
| 72 | 1 | 1 | 4 | — | 2 |
| 73 | 1 | 1 | 4 | — | 2 |
| 74 | 1 | 1 | 4 | — | 2 |
| 75 | 1 | 1 | 4 | — | 2 |
| 76 | 1 | 1 | 4 | — | 2 |
| 77 | 1 | 1 | 1 | — | 2 |
| 78 | 1 | 1 | 1 | — | 2 |
| 79 | 1 | 1 | 1 | — | 2 |
| 80 | 1 | 1 | 1 | — | 2 |
| 81 | 1 | 1 | 1 | — | 2 |
| 82 | 1 | 1 | 1 | — | 2 |
| 83 | 1 | 1 | 1 | — | 2 |
| 84 | 1 | 1 | 1 | — | 2 |
| 85 | 1 | 1 | 1 | — | 2 |
| 86 | 1 | 1 | 1 | — | 2 |
| 87 | 1 | 1 | 1 | — | 2 |
| 88 | 1 | 1 | 7 | — | 2 |
| 89 | 1 | 1 | 8 | — | 2 |
| 90 | 1 | 1 | 7 | — | 2 |
| 91 | 1 | 1 | 7 | — | 2 |
| 92 | 1 | 1 | 8 | — | 2 |
| 93 | 1 | 1 | 8 | — | 2 |
| 94 | 1 | 1 | 4 | — | 2 |
| 95 | 1 | 1 | 4 | — | 2 |
| 96 | 1 | 1 | 1 | 1 | 2 |
| 97 | 1 | 1 | 1 | 2 | 2 |

TABLE 7

| Comparative Example No. | Surface Layer (A Layer) Condition No. | Middle Layer (B Layer) Condition No. | Underlayer (C Layer) Condition No. | Heat Treatment Condition No. | Material No. |
|---|---|---|---|---|---|
| 1 | 1 | — | 1 | 1 | 1 |
| 2 | 1 | — | 1 | 1 | 1 |
| 3 | 1 | — | 1 | — | 1 |
| 4 | 1 | 8 | 1 | 1 | 1 |
| 5 | 1 | 8 | 1 | 1 | 1 |
| 6 | 1 | 8 | 1 | — | 1 |
| 7 | 1 | — | 2 | 1 | 1 |
| 8 | 1 | — | 1 | 1 | 1 |
| 9 | 1 | 1 | — | — | 1 |
| 10 | 1 | 1 | — | — | 1 |
| 11 | 1 | 1 | — | — | 1 |
| 12 | 1 | — | — | — | 1 |
| 13 | 1 | 1 | — | — | 1 |
| 14 | 1 | — | — | — | 1 |
| 15 | 1 | 1 | — | — | 1 |
| 16 | 1 | 1 | — | — | 1 |
| 17 | 3 | 7 | — | — | 1 |
| 18 | 2 | — | — | — | 1 |
| 19 | 3 | 7 | 1 | — | 2 |
| 20 | 2 | — | 1 | — | 2 |
| 21 | 1 | — | 1 | — | 2 |
| 22 | 1 | 1 | 1 | — | 2 |
| 23 | 1 | — | 1 | — | 2 |

Measurement of a Thickness

The thicknesses of a surface layer (A layer), a middle layer (B layer) and an underlayer (C layer) were measured by carrying out the each surface treatment on a base material not having any composition of the surface layer (A layer), the middle layer (B layer) and the underlayer (C layer), and measuring respective actual thicknesses by an X-ray fluorescent film thickness meter (made by Seiko Instruments Inc., SEA5100, collimator: 0.1 mmϕ). For example, in the case of an Sn plating, if the base material is a Cu-10 mass % Sn-0.15 mass % P material, since the base material has Sn and the thickness of Sn plating cannot be determined exactly, the thickness of the surface layer (A layer) was measured using a base material of Cu-30 mass % Zn, which had no Sn.

Measurement of a Deposition Amount

Each sample was acidolyzed with sulfuric acid, nitric acid or the like, and measured for a deposition amount of each metal by ICP (inductively coupled plasma) atomic emission spectroscopy. The acid to be specifically used depended on the composition of the each sample.

Determination of a Composition

The composition of each metal was calculated based on the measured deposition amount.

Determination of a Layer Structure

The layer structure of the obtained sample was determined by a depth profile by XPS (X-ray photoelectron spectroscopy) analysis. The analyzed elements were compositions of a surface layer (A layer), a middle layer (B layer) and an underlayer (C layer), and C and O. These elements were made as designated elements. With the total of the designated elements being taken to be 100%, the concentration (at %) of the each element was analyzed. The thickness by the XPS (X-ray photoelectron spectroscopy) analysis corresponds to a distance (in terms of $SiO_2$) on the abscissa of the chart by the analysis.

The surface of the obtained sample was also subjected to a qualitative analysis by a survey measurement by XPS (X-ray photoelectron spectroscopy) analysis. The resolution of the concentration by the qualitative analysis was set at 0.1 at %.

An XPS apparatus to be used was 5600MC, made by Ulvac-Phi, Inc, and the measurement was carried out under the conditions of ultimate vacuum: $5.7 \times 10^{-9}$ Torr, exciting source: monochromated AlKα, output: 210 W, detection area: 800 μmϕ, incident angle: 45°, takeoff angle: 45°, and no neutralizing gun, and under the following sputtering condition.

Ion species: $Ar^+$
Acceleration voltage: 3 kV
Sweep region: 3 mm×3 mm
Rate: 2.8 nm/min (in terms of $SiO_2$)

Evaluations

Each sample was evaluated for the following.

A. Inserting/Extracting Force

The inserting/extracting force was evaluated by using a commercially available Sn reflow-plated female terminal (090-type Sumitomo TS/Yazaki 090II series female terminal, non-waterproof/F090-SMTS) and subjecting the female terminal to an insertion/extraction test with each plated male terminal of Examples and Comparative Examples.

A measurement apparatus used in the test was 1311NR, made by Aikoh Engineering Co., Ltd., and the evaluation used 5 mm as a slide distance of a male pin. The number of the samples was set to be five; and since in the inserting/extracting force, the inserting force and the extracting force were identical, an average value of maximum inserting forces of the 5 samples was employed. A blank material employed for the inserting/extracting force was samples of Comparative Example 1.

The target of the inserting/extracting force was lower than 90% of the maximum inserting/extracting force of Comparative Example 1. The target was because Comparative Example 4 exhibited an inserting force of 90% of the maximum inserting force of Comparative Example 1, and also exhibited good durability (heat resistance, gas corrosion resistance, solder wettability and the like); then, a more reduction of the inserting/extracting force than in Comparative Example 4 was targeted.

B. Whisker

Whiskers were evaluated by a load test (ball penetrator method) according to JEITA RC-5241. That is, a load test was carried out on each sample; and the sample whose load test had been finished was observed at a magnification of 100 to 10,000 times by a SEM (made by JEOL Ltd., type: JSM-5410) to observe the generation situation of whiskers. The load test condition is shown in the below.

Diameter of the ball penetrator: ϕ1 mm±0.1 mm
Test load: 2 N±0.2 N
Test time: 120 hours The target property was that no whiskers of 20 μm or longer in length were generated, but the top target was that no one whisker at all was generated.

C. Contact Resistance

The contact resistance was measured using a contact simulator CRS-113-Au, made by Yamasaki-Seiki Co., Ltd., by a four-terminal method under the condition of a contact load of 50 g. The number of the samples was made to be five, and a range of from the minimum value to the maximum value of the samples was employed. The target property was a contact resistance of 10 mΩ or lower. The contact resistance was classified into 1 to 3 mΩ, 3 to 5 mΩ, and higher than 5 mΩ.

D. Heat Resistance

The heat resistance was evaluated by measuring the contact resistance of a sample after an atmospheric heating (155° C.×500 h) test. The target property was a contact resistance of 10 mΩ or lower, but the top target was made to be no variation (being equal) in the contact resistance before and after the heat resistance test. The heat resistance was classified into 1 to 4 mΩ, 2 to 4 mΩ, 2 to 5 mΩ, 3 to 6 mΩ, 3 to 7 mΩ, 6 to 9 mΩ, and higher than 10 mΩ in terms of contact resistance.

E. Gas Corrosion Resistance

The gas corrosion resistance was evaluated by three test environments shown in the following (1) to (3). The evaluation of the gas corrosion resistance was carried out by using the contact resistance of a sample after the environment tests of (1) to (3). The target property was a contact resistance of 10 mΩ or lower, but the top target was made to be no variation (being equal) in the contact resistance before and after the gas corrosion resistance test. The gas corrosion resistance was classified into 1 to 3 mΩ, 1 to 4 mΩ, 2 to 4 mΩ, 2 to 6 mΩ, 3 to 5 mΩ, 3 to 7 mΩ, 4 to 7 mΩ, 5 to 8 mΩ, 6 to 9 mΩ, and higher than 10 mΩ in terms of contact resistance.

(1) Salt Spray Test
Salt concentration: 5%
Temperature: 35° C.
Spray pressure: 98±10 kPa
Exposure time: 96 h (2) Sulfurous Acid Gas Corrosion Test
Sulfurous acid concentration: 25 ppm
Temperature: 40° C.

Humidity: 80% RH
Exposure time: 96 h
(3) Hydrogen Sulfide Gas Corrosion Test
Sulfurous acid concentration: 3 ppm
Temperature: 40° C.
Humidity: 80% RH
Exposure time: 96 h
F. Solder Wettability The solder wettability was evaluated by using a sample after plating. The solder wetting time was measured using a Solder Checker (made by Rhesca Corp., SAT-5000) and using a commercially available 25% rosin methanol flux as a flux by a meniscography. The solder to be used was Sn-3Ag-0.5Cu (250° C.). The number of the samples was made to be five, and a range of from the minimum value to the maximum value of the samples was employed. The target property was 5 sec or less in terms of zero cross time. The zero cross was classified into 1 to 3 sec, 2 to 3 sec, 3 to 5 sec, 4 to 5 sec, and more than 5 sec.

G. Bending Workability

The bending workability was evaluated by a 90° bending of a sample under the condition that the ratio of the thickness and the bending radius of the sample became 1 by using a letter-W-shape die. The evaluation was made as ○ in the case where no crack was observed in the observation of the surface of the bending-worked portion by an optical microscope, posing no practical problem; and as x in the case where any cracks were observed therein.

H. Vickers Hardness

The Vickers hardness of a surface layer (A layer) was measured by making an impression by a load of 980.7 mN (Hv0.1) from the sample surface in a load retention time of 15 sec.

The Vickers hardness of an underlayer (C layer) was measured by making an impression by a load of 980.7 mN (Hv0.1) from the underlayer (C layer) cross-section in a load retention time of 15 sec.

I. Indentation Hardness

The indentation hardness of a surface layer (A layer) was measured by making an impression on the sample surface at a load of 0.1 mN by an ultrafine hardness tester (ENT-2100, made by Elionix Inc.).

The indentation hardness of an underlayer (C layer) was measured by making an impression from the underlayer (C layer) cross-section at a load of 980.7 mN (Hv0.1) in a load retention time of 15 sec.

J. Surface Roughness

The surface roughnesses (arithmetic mean deviation (Ra) and maximum height (Rz)) were measured according to JIS B 0601 by using a non-contact type three dimensional measurement instrument (made by Mitaka Kohki Co., Ltd., type: NH-3). The measurement was carried out five times per one sample, with a cutoff of 0.25 mm and a measurement length of 1.50 mm.

K. Reflection Density

The reflection density was measured using a densitometer (ND-1, made by Nippon Denshoku Industries Co., Ltd.).

L. Elongation

The elongation was measured by carrying out a tensile test in the rolling-parallel direction of each sample according to JIS C 6511. The tension rate was set at 50 mm/min.

M. Minimum Bending Radius Ratio (MBR/t)

The minimum bending radius ratio was measured as a minimum bending radius/specimen thickness where no crack was generated by the same method as in the bending workability.

The respective conditions and evaluation results are shown in Tables 8 to 22.

TABLE 8

| | | Surface Layer (A Layer) | | | Middle Layer (B Layer) | | | Underlayer (C Layer) | | | | |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | Heat Treatment Condition | Base Material Composition |
| Example | 1 | Sn | 0.200 | 145.6 | Ag | 0.300 | 315.0 | | | | None | Cu—30Zn(¼H) |
| | 2 | Sn | 0.200 | 145.6 | Ag | 0.001 | 1.1 | | | | None | Cu—30Zn(¼H) |
| | 3 | Sn | 0.030 | 21.8 | Ag | 0.030 | 31.5 | | | | None | Cu—30Zn(¼H) |
| | 4 | Sn | 0.002 | 1.5 | Ag | 0.300 | 315.0 | | | | None | Cu—30Zn(¼H) |
| | 5 | Sn | 0.002 | 1.5 | Ag | 0.001 | 1.1 | | | | None | Cu—30Zn(¼H) |
| | 6 | Sn | 0.030 | 21.8 | Ag | 0.030 | 31.5 | | | | None | Cu—30Zn(¼H) |
| | 7 | In | 0.030 | 21.8 | Ag | 0.030 | 31.5 | | | | None | Cu—30Zn(¼H) |
| | 8 | Sn—2Ag | 0.030 | 21.8 | Ag | 0.030 | 31.5 | | | | None | Cu—30Zn(¼H) |
| | 9 | Sn—2As | 0.030 | 21.8 | Ag | 0.030 | 31.5 | | | | None | Cu—30Zn(¼H) |
| | 10 | Sn—2Au | 0.030 | 21.8 | Ag | 0.030 | 31.5 | | | | None | Cu—30Zn(¼H) |
| | 11 | Sn—2Bi | 0.030 | 21.8 | Ag | 0.030 | 31.5 | | | | None | Cu—30Zn(¼H) |
| | 12 | Sn—2Cd | 0.030 | 21.8 | Ag | 0.030 | 31.5 | | | | None | Cu—30Zn(¼H) |
| | 13 | Sn—2Co | 0.030 | 21.8 | Ag | 0.030 | 31.5 | | | | None | Cu—30Zn(¼H) |
| | 14 | Sn—2Cr | 0.030 | 21.8 | Ag | 0.030 | 31.5 | | | | None | Cu—30Zn(¼H) |
| | 15 | Sn—2Cu | 0.030 | 21.8 | Ag | 0.030 | 31.5 | | | | None | Cu—30Zn(¼H) |
| | 16 | Sn—2Fe | 0.030 | 21.8 | Ag | 0.030 | 31.5 | | | | None | Cu—30Zn(¼H) |
| | 17 | Sn—2In | 0.030 | 21.8 | Ag | 0.030 | 31.5 | | | | None | Cu—30Zn(¼H) |
| | 18 | Sn—2Mn | 0.030 | 21.8 | Ag | 0.030 | 31.5 | | | | None | Cu—30Zn(¼H) |
| | 19 | Sn—2Mo | 0.030 | 21.8 | Ag | 0.030 | 31.5 | | | | None | Cu—30Zn(¼H) |
| | 20 | Sn—2Ni | 0.030 | 21.8 | Ag | 0.030 | 31.5 | | | | None | Cu—30Zn(¼H) |
| | 21 | Sn—2Pb | 0.030 | 21.8 | Ag | 0.030 | 31.5 | | | | None | Cu—30Zn(¼H) |
| | 22 | Sn—2Sb | 0.030 | 21.8 | Ag | 0.030 | 31.5 | | | | None | Cu—30Zn(¼H) |
| | 23 | Sn—2W | 0.030 | 21.8 | Ag | 0.030 | 31.5 | | | | None | Cu—30Zn(¼H) |
| | 24 | Sn—2Zn | 0.030 | 21.8 | Ag | 0.030 | 31.5 | | | | None | Cu—30Zn(¼H) |
| | 25 | Sn | 0.030 | 21.8 | Au | 0.030 | 31.5 | | | | None | Cu—30Zn(¼H) |
| | 26 | Sn | 0.030 | 21.8 | Pt | 0.030 | 31.5 | | | | None | Cu—30Zn(¼H) |
| | 27 | Sn | 0.030 | 21.8 | Pd | 0.030 | 31.5 | | | | None | Cu—30Zn(¼H) |
| | 28 | Sn | 0.030 | 21.8 | Ru | 0.030 | 31.5 | | | | None | Cu—30Zn(¼H) |
| | 29 | Sn | 0.030 | 21.8 | Rh | 0.030 | 31.5 | | | | None | Cu—30Zn(¼H) |
| | 30 | Sn | 0.030 | 21.8 | Os | 0.030 | 31.5 | | | | None | Cu—30Zn(¼H) |
| | 31 | Sn | 0.030 | 21.8 | Ir | 0.030 | 31.5 | | | | None | Cu—30Zn(¼H) |

TABLE 8-continued

| | | Surface Layer (A Layer) | | | Middle Layer (B Layer) | | | Underlayer (C Layer) | | | | |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | Heat Treatment Condition | Base Material Composition |
| | 32 | Sn | 0.030 | 21.8 | Ag—2Au | 0.030 | 31.5 | | | | None | Cu—30Zn(¼H) |
| | 33 | Sn | 0.030 | 21.8 | Ag—2Bi | 0.030 | 31.5 | | | | None | Cu—30Zn(¼H) |
| | 34 | Sn | 0.030 | 21.8 | Ag—2Cd | 0.030 | 31.5 | | | | None | Cu—30Zn(¼H) |
| | 35 | Sn | 0.030 | 21.8 | Ag—2Co | 0.030 | 31.5 | | | | None | Cu—30Zn(¼H) |
| | 36 | Sn | 0.030 | 21.8 | Ag—2Cu | 0.030 | 31.5 | | | | None | Cu—30Zn(¼H) |
| | 37 | Sn | 0.030 | 21.8 | Ag—2Fe | 0.030 | 31.5 | | | | None | Cu—30Zn(¼H) |
| | 38 | Sn | 0.030 | 21.8 | Ag—2In | 0.030 | 31.5 | | | | None | Cu—30Zn(¼H) |
| | 39 | Sn | 0.030 | 21.8 | Ag—2Ir | 0.030 | 31.5 | | | | None | Cu—30Zn(¼H) |
| | 40 | Sn | 0.030 | 21.8 | Ag—2Mn | 0.030 | 31.5 | | | | None | Cu—30Zn(¼H) |
| Target | | | 0.002≤ ≤0.2 | 1≤ ≤150 | | 0.001≤ ≤0.3 | 1≤ ≤330 | | | | | |

TABLE 9

| | | Surface Layer (A Layer) | | | Middle Layer (B Layer) | | | Underlayer (C Layer) | | | | |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | Heat Treatment Condition | Base Material Composition |
| Example | 41 | Sn | 0.030 | 21.8 | Ag—2Mo | 0.030 | 31.5 | | | | None | Cu—30Zn(¼H) |
| | 42 | Sn | 0.030 | 21.8 | Ag—2Ni | 0.030 | 31.5 | | | | None | Cu—30Zn(¼H) |
| | 43 | Sn | 0.030 | 21.8 | Ag—2Pb | 0.030 | 31.5 | | | | None | Cu—30Zn(¼H) |
| | 44 | Sn | 0.030 | 21.8 | Ag—2Pd | 0.030 | 31.5 | | | | None | Cu—30Zn(¼H) |
| | 45 | Sn | 0.030 | 21.8 | Ag—2Pt | 0.030 | 31.5 | | | | None | Cu—30Zn(¼H) |
| | 46 | Sn | 0.030 | 21.8 | Ag—2Rh | 0.030 | 31.5 | | | | None | Cu—30Zn(¼H) |
| | 47 | Sn | 0.030 | 21.8 | Ag—2Ru | 0.030 | 31.5 | | | | None | Cu—30Zn(¼H) |
| | 48 | Sn | 0.030 | 21.8 | Ag—2Sb | 0.030 | 31.5 | | | | None | Cu—30Zn(¼H) |
| | 49 | Sn | 0.030 | 21.8 | Ag—2Se | 0.030 | 31.5 | | | | None | Cu—30Zn(¼H) |
| | 50 | Sn | 0.030 | 21.8 | Ag—2Sn | 0.030 | 31.5 | | | | None | Cu—30Zn(¼H) |
| | 51 | Sn | 0.030 | 21.8 | Ag—2W | 0.030 | 31.5 | | | | None | Cu—30Zn(¼H) |
| | 52 | Sn | 0.030 | 21.8 | Ag—2Tl | 0.030 | 31.5 | | | | None | Cu—30Zn(¼H) |
| | 53 | Sn | 0.030 | 21.8 | Ag—2Zn | 0.030 | 31.5 | | | | None | Cu—30Zn(¼H) |
| Comparative Example | 1 | Sn | 1.000 | 728.0 | | | | Ni | 0.5 | 0.4 | 300° C. × 5 sec | Cu—30Zn(¼H) |
| | 2 | Sn | 0.600 | 436.8 | | | | Ni | 0.5 | 0.4 | 300° C. × 5 sec | Cu—30Zn(¼H) |
| | 3 | Sn | 0.600 | 436.8 | | | | Ni | 0.5 | 0.4 | | Cu—30Zn(¼H) |
| | 4 | Sn | 0.600 | 436.8 | Cu | 0.300 | | Ni | 0.5 | 0.4 | 300° C. × 5 sec | Cu—30Zn(¼H) |
| | 5 | Sn | 0.400 | 291.2 | Cu | 0.300 | | Ni | 0.5 | 0.4 | 300° C. × 5 sec | Cu—30Zn(¼H) |
| | 6 | Sn | 0.400 | 291.2 | Cu | 0.300 | | Ni | 0.5 | 0.4 | | Cu—30Zn(¼H) |
| | 7 | Sn | 1.000 | 728.0 | | | | Cu | 0.5 | 0.4 | 300° C. × 5 sec | Cu—30Zn(¼H) |
| | 8 | Sn | 1.000 | 728.0 | | | | Ni | 1.0 | 0.9 | 300° C. × 5 sec | Cu—30Zn(¼H) |
| | 9 | Sn | 0.300 | 218.4 | Ag | 0.300 | 315.0 | | | | None | Cu—30Zn(¼H) |
| | 10 | Sn | 0.300 | 218.4 | Ag | 0.001 | 1.1 | | | | None | Cu—30Zn(¼H) |
| | 11 | Sn | 0.200 | 145.6 | Ag | 0.500 | 525.0 | | | | None | Cu—30Zn(¼H) |
| | 12 | Sn | 0.200 | 145.6 | Ag | | | | | | None | Cu—30Zn(¼H) |
| | 13 | Sn | 0.002 | 1.5 | Ag | 0.500 | 525.0 | | | | None | Cu—30Zn(¼H) |
| | 14 | Sn | 0.002 | 1.5 | Ag | | | | | | None | Cu—30Zn(¼H) |
| | 15 | Sn | 0.001 | 0.7 | Ag | 0.300 | 315.0 | | | | None | Cu—30Zn(¼H) |
| | 16 | Sn | 0.001 | 0.7 | Ag | 0.001 | 1.1 | | | | None | Cu—30Zn(¼H) |
| | 17 | Ag | 0.030 | 31.5 | Sn | 0.030 | 21.8 | | | | None | Cu—30Zn(¼H) |
| | 18 | Sn—50Ag | 0.030 | 26.7 | | | | | | | None | Cu—30Zn(¼H) |
| Target | | | 0.002≤ ≤0.2 | 1≤ ≤150 | | 0.001≤ ≤0.3 | 1≤ ≤330 | | | | | |

TABLE 10

| | | Whisker | | Inserting/Extracting Force | | | | Gas Corrosion Resistance | | | Solder | |
|---|---|---|---|---|---|---|---|---|---|---|---|---|
| | | Number of Whiskers of Shorter Than 20 μm in Length [number] | Number of Whiskers of 20 μm or Longer in Length [number] | Maximum Inserting Force [N] | Maximum Inserting Force/ Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | Wetting Zero Cross Time [sec] | Comprehensive Judgment |
| Example | 1 | ≤1 | 0 | 5.34 | 89 | 1-3 | 2-4 | 2-4 | 2-4 | 2-4 | 1-3 | ○ |
| | 2 | ≤1 | 0 | 5.16 | 86 | 1-3 | 6-9 | 2-4 | 2-4 | 2-4 | 4-5 | ○ |
| | 3 | 0 | 0 | 5.04 | 84 | 1-3 | 2-4 | 2-4 | 2-4 | 2-4 | 1-3 | ○ |
| | 4 | 0 | 0 | 5.16 | 86 | 1-3 | 2-4 | 4-7 | 5-8 | 6-9 | 1-3 | ○ |
| | 5 | 0 | 0 | 4.98 | 83 | 1-3 | 6-9 | 4-7 | 5-8 | 6-9 | 4-5 | ○ |
| | 6 | 0 | 0 | 5.04 | 84 | 1-3 | 2-4 | 2-4 | 2-4 | 2-4 | 1-3 | ○ |
| | 7 | 0 | 0 | 5.04 | 84 | 1-3 | 2-4 | 2-4 | 2-4 | 2-4 | 1-3 | ○ |
| | 8 | 0 | 0 | 5.04 | 84 | 1-3 | 2-4 | 2-4 | 2-4 | 2-4 | 1-3 | ○ |
| | 9 | 0 | 0 | 5.04 | 84 | 1-3 | 2-4 | 2-4 | 2-4 | 2-4 | 1-3 | ○ |
| | 10 | 0 | 0 | 5.04 | 84 | 1-3 | 2-4 | 2-4 | 2-4 | 2-4 | 1-3 | ○ |
| | 11 | 0 | 0 | 5.04 | 84 | 1-3 | 2-4 | 2-4 | 2-4 | 2-4 | 1-3 | ○ |
| | 12 | 0 | 0 | 5.04 | 84 | 1-3 | 2-4 | 2-4 | 2-4 | 2-4 | 1-3 | ○ |
| | 13 | 0 | 0 | 5.04 | 84 | 1-3 | 2-4 | 2-4 | 2-4 | 2-4 | 1-3 | ○ |
| | 14 | 0 | 0 | 5.04 | 84 | 1-3 | 2-4 | 2-4 | 2-4 | 2-4 | 1-3 | ○ |
| | 15 | 0 | 0 | 5.04 | 84 | 1-3 | 2-4 | 2-4 | 2-4 | 2-4 | 1-3 | ○ |
| | 16 | 0 | 0 | 5.04 | 84 | 1-3 | 2-4 | 2-4 | 2-4 | 2-4 | 1-3 | ○ |
| | 17 | 0 | 0 | 5.04 | 84 | 1-3 | 2-4 | 2-4 | 2-4 | 2-4 | 1-3 | ○ |
| | 18 | 0 | 0 | 5.04 | 84 | 1-3 | 2-4 | 2-4 | 2-4 | 2-4 | 1-3 | ○ |
| | 19 | 0 | 0 | 5.04 | 84 | 1-3 | 2-4 | 2-4 | 2-4 | 2-4 | 1-3 | ○ |
| | 20 | 0 | 0 | 5.04 | 84 | 1-3 | 2-4 | 2-4 | 2-4 | 2-4 | 1-3 | ○ |
| | 21 | 0 | 0 | 5.04 | 84 | 1-3 | 2-4 | 2-4 | 2-4 | 2-4 | 1-3 | ○ |
| | 22 | 0 | 0 | 5.04 | 84 | 1-3 | 2-4 | 2-4 | 2-4 | 2-4 | 1-3 | ○ |
| | 23 | 0 | 0 | 5.04 | 84 | 1-3 | 2-4 | 2-4 | 2-4 | 2-4 | 1-3 | ○ |
| | 24 | 0 | 0 | 5.04 | 84 | 1-3 | 2-4 | 2-4 | 2-4 | 2-4 | 1-3 | ○ |
| | 25 | 0 | 0 | 5.04 | 84 | 1-3 | 2-4 | 2-4 | 2-4 | 2-4 | 1-3 | ○ |
| | 26 | 0 | 0 | 5.04 | 84 | 1-3 | 2-4 | 2-4 | 2-4 | 2-4 | 1-3 | ○ |
| | 27 | 0 | 0 | 5.04 | 84 | 1-3 | 2-4 | 2-4 | 2-4 | 2-4 | 1-3 | ○ |
| | 28 | 0 | 0 | 5.04 | 84 | 1-3 | 2-4 | 2-4 | 2-4 | 2-4 | 1-3 | ○ |
| | 29 | 0 | 0 | 5.04 | 84 | 1-3 | 2-4 | 2-4 | 2-4 | 2-4 | 1-3 | ○ |
| | 30 | 0 | 0 | 5.04 | 84 | 1-3 | 2-4 | 2-4 | 2-4 | 2-4 | 1-3 | ○ |
| | 31 | 0 | 0 | 5.04 | 84 | 1-3 | 2-4 | 2-4 | 2-4 | 2-4 | 1-3 | ○ |
| | 32 | 0 | 0 | 5.04 | 84 | 1-3 | 2-4 | 2-4 | 2-4 | 2-4 | 1-3 | ○ |
| | 33 | 0 | 0 | 5.04 | 84 | 1-3 | 2-4 | 2-4 | 2-4 | 2-4 | 1-3 | ○ |
| | 34 | 0 | 0 | 5.04 | 84 | 1-3 | 2-4 | 2-4 | 2-4 | 2-4 | 1-3 | ○ |
| | 35 | 0 | 0 | 5.04 | 84 | 1-3 | 2-4 | 2-4 | 2-4 | 2-4 | 1-3 | ○ |
| | 36 | 0 | 0 | 5.04 | 84 | 1-3 | 2-4 | 2-4 | 2-4 | 2-4 | 1-3 | ○ |
| | 37 | 0 | 0 | 5.04 | 84 | 1-3 | 2-4 | 2-4 | 2-4 | 2-4 | 1-3 | ○ |
| | 38 | 0 | 0 | 5.04 | 84 | 1-3 | 2-4 | 2-4 | 2-4 | 2-4 | 1-3 | ○ |
| | 39 | 0 | 0 | 5.04 | 84 | 1-3 | 2-4 | 2-4 | 2-4 | 2-4 | 1-3 | ○ |
| | 40 | 0 | 0 | 5.04 | 84 | 1-3 | 2-4 | 2-4 | 2-4 | 2-4 | 1-3 | ○ |
| Target | | | 0 | | <90 | ≤10 | ≤10 | ≤10 | ≤10 | ≤10 | ≤5 | |

TABLE 11

| | | Whisker | | Inserting/Extracting Force | | | | Gas Corrosion Resistance | | | | |
|---|---|---|---|---|---|---|---|---|---|---|---|---|
| | | Number of Whiskers of Shorter Than 20 μm in Length [number] | Number of Whiskers of 20 μm or Longer in Length [number] | Maximum Inserting Force [N] | Maximum Inserting Force/ Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | Solder Wetting Zero Cross Time [sec] | Comprehensive Judgment |
| Example | 41 | 0 | 0 | 5.04 | 84 | 1-3 | 2-4 | 2-4 | 2-4 | 2-4 | 1-3 | ○ |
| | 42 | 0 | 0 | 5.04 | 84 | 1-3 | 2-4 | 2-4 | 2-4 | 2-4 | 1-3 | ○ |
| | 43 | 0 | 0 | 5.04 | 84 | 1-3 | 2-4 | 2-4 | 2-4 | 2-4 | 1-3 | ○ |

TABLE 11-continued

| | | Whisker | | Inserting/Extracting Force | | | | Gas Corrosion Resistance | | | | |
|---|---|---|---|---|---|---|---|---|---|---|---|---|
| | | Number of Whiskers of Shorter Than 20 μm in Length [number] | Number of Whiskers of 20 μm or Longer in Length [number] | Maximum Inserting Force [N] | Maximum Inserting Force/ Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | Solder Wetting Zero Cross Time [sec] | Comprehensive Judgment |
| | 44 | 0 | 0 | 5.04 | 84 | 1-3 | 2-4 | 2-4 | 2-4 | 2-4 | 1-3 | ○ |
| | 45 | 0 | 0 | 5.04 | 84 | 1-3 | 2-4 | 2-4 | 2-4 | 2-4 | 1-3 | ○ |
| | 46 | 0 | 0 | 5.04 | 84 | 1-3 | 2-4 | 2-4 | 2-4 | 2-4 | 1-3 | ○ |
| | 47 | 0 | 0 | 5.04 | 84 | 1-3 | 2-4 | 2-4 | 2-4 | 2-4 | 1-3 | ○ |
| | 48 | 0 | 0 | 5.04 | 84 | 1-3 | 2-4 | 2-4 | 2-4 | 2-4 | 1-3 | ○ |
| | 49 | 0 | 0 | 5.04 | 84 | 1-3 | 2-4 | 2-4 | 2-4 | 2-4 | 1-3 | ○ |
| | 50 | 0 | 0 | 5.04 | 84 | 1-3 | 2-4 | 2-4 | 2-4 | 2-4 | 1-3 | ○ |
| | 51 | 0 | 0 | 5.04 | 84 | 1-3 | 2-4 | 2-4 | 2-4 | 2-4 | 1-3 | ○ |
| | 52 | 0 | 0 | 5.04 | 84 | 1-3 | 2-4 | 2-4 | 2-4 | 2-4 | 1-3 | ○ |
| | 53 | 0 | 0 | 5.04 | 84 | 1-3 | 2-4 | 2-4 | 2-4 | 2-4 | 1-3 | ○ |
| Comparative Example | 1 | — | ≤3 | 6 | — | 1-3 | 3-7 | 1-3 | 1-3 | 1-3 | 1-3 | — |
| | 2 | | | | | 1-3 | | | | | 5< | X |
| | 3 | | | 7.2 | 120 | 1-3 | | | | | 1-3 | X |
| | 4 | | | 5.4 | 90 | 1-3 | 3-7 | 1-3 | 1-3 | 1-3 | 1-3 | X |
| | 5 | | | | | 1-3 | | | | | 5< | X |
| | 6 | | | 6.3 | 105 | 1-3 | | | | | 1-3 | X |
| | 7 | — | ≤3 | 6 | 100 | 1-3 | 3-7 | 1-3 | 1-3 | 1-3 | 1-3 | X |
| | 8 | — | ≤3 | 6 | 100 | 1-3 | 3-7 | 1-3 | 1-3 | 1-3 | 1-3 | X |
| | 9 | 1-5 | 0 | 5.46 | 91 | 1-3 | | | | | 1-3 | X |
| | 10 | 1-5 | 0 | 5.28 | 88 | 1-3 | | | | | 4-5 | X |
| | 11 | | | 5.58 | 93 | 1-3 | | | | | 1-3 | X |
| | 12 | | | | | 1-3 | | | | | 5< | X |
| | 13 | | | 5.4 | 90 | 1-3 | | | | | 1-3 | X |
| | 14 | | | | | 1-3 | | | | | 5< | X |
| | 15 | | | | | 1-3 | | | | 10< | 1-3 | X |
| | 16 | | | | | 1-3 | | | | 10< | 4-5 | X |
| | 17 | | | | | 1-3 | | | | 10< | 1-3 | X |
| | 18 | | | | | 1-3 | | | | 10< | 1-3 | X |
| Target | | | 0 | | <90 | ≤10 | ≤10 | ≤10 | ≤10 | ≤10 | ≤5 | |

TABLE 12

| | | Surface Layer (A Layer) | | | Middle Layer (B Layer) | | | Underlayer (C Layer) | | |
|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] |
| Example | 1 | Sn | 0.200 | 145.6 | Ag | 0.3 | 315 | | | |
| | 54 | Sn | 0.200 | 145.6 | Ag | 0.3 | 315 | | | |
| | 55 | Sn | 0.200 | 145.6 | Ag | 0.3 | 315 | | | |
| | 56 | Sn | 0.200 | 145.6 | Ag | 0.3 | 315 | | | |
| Target | | | 0.002≤ ≤0.2 | 1≤ ≤150 | | 0.001≤ ≤0.3 | 1≤ ≤330 | | | |

| | | Heat Treatment Condition | Base Material Composition | Vickers Hardness Hv | Indentation Hardness [MPa] | Maximum Inserting Force [N] | Maximum Inserting Force/ Maximum Inserting Force of Comparative Example 1 [%] | Bending Workability |
|---|---|---|---|---|---|---|---|---|
| Example | 1 | None | Cu—30Zn(¼H) | 130 | 1500 | 5.34 | 89 | ○ |
| | 54 | None | Cu—30Zn(H) | 300 | 3400 | 5.10 | 85 | ○ |

TABLE 12-continued

|   |   |   |   |   |   |   |   |
|---|---|---|---|---|---|---|---|
|   | 55 | None | Cu—10Sn—0.15P(EH) | 600 | 6700 | 4.20 | 70 | ○ |
|   | 56 | None | Cu—3Ti(SH) | 1200 | 13000 | 3.90 | 65 | X |
| Target |   |   |   |   |   |   | <90 |   |

TABLE 13

| | | Surface Layer (A Layer) | | | Middle Layer (B Layer) | | | Underlayer (C Layer) | | | Heat Treatment Condition |
|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | |
| Example | 54 | Sn | 0.2(Dk = 4) | 145.6 | Ag | 0.3(Dk = 4) | 315 | | | | None |
| | 57 | Sn | 0.2(Dk = 4) | 145.6 | Ag | 0.3(Dk = 0.5) | 315 | | | | None |
| | 58 | Sn | 0.2(Dk = 0.5) | 145.6 | Ag | 0.3(Dk = 4) | 315 | | | | None |
| | 59 | Sn | 0.2(Dk = 0.5) | 145.6 | Ag | 0.3(Dk = 0.5) | 315 | | | | None |
| Target | | | 0.002≤ ≤0.2 | 1≤ ≤150 | | 0.001≤ ≤0.3 | 1≤ ≤330 | | | | |

| | | Base Material Composition | Evaluation from Surface Layer | | | Contact Resistance [mΩ] | Heat Resistance Contact Resistance [mΩ] | Salt Spray Contact Resistance [mΩ] | Gas Corrosion Resistance | | Solder Wetting Zero Cross Time [sec] |
|---|---|---|---|---|---|---|---|---|---|---|---|
| | | | Arithmetic Mean deviation Ra [μm] | Maximum Height Rz [μm] | Reflection Density | | | | Sulfurous Acid Gas Contact Resistance [mΩ] | Hydrogen Sulfide Contact Resistance [mΩ] | |
| Example | 54 | Cu—30Zn(H) | 0.12 | 1.25 | 0.2 | 1-3 | 2-4 | 2-4 | 2-4 | 2-4 | 1-3 |
| | 57 | Cu—30Zn(H) | 0.087 | 0.75 | 0.3 | 1-3 | 2-4 | 1-3 | 1-3 | 1-3 | 1-3 |
| | 58 | Cu—30Zn(H) | 0.075 | 0.55 | 0.7 | 1-3 | 2-4 | 1-3 | 1-3 | 1-3 | 1-3 |
| | 59 | Cu—30Zn(H) | 0.045 | 0.35 | 0.9 | 1-3 | 2-4 | 1-3 | 1-3 | 1-3 | 1-3 |
| Target | | | | | | ≤10 | ≤10 | ≤10 | ≤10 | ≤10 | ≤5 |

TABLE 14

| | | Surface Layer (A Layer) | | | Middle Layer (B Layer) | | | Underlayer (C Layer) | | | Heat Treatment Condition | Base Material Composition |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | | |
| Example | 3 | Sn | 0.030 | 21.8 | Ag | 0.030 | 31.5 | | | | None | Cu—30Zn(¼H) |
| | 5 | Sn | 0.002 | 1.5 | Ag | 0.001 | 1.1 | | | | None | Cu—30Zn(¼H) |
| Comparative | 14 | Sn | 0.002 | 1.5 | Ag | | | | | | None | Cu—30Zn(¼H) |
| | 16 | Sn | 0.001 | 0.7 | Ag | 0.001 | 1.1 | | | | None | Cu—30Zn(¼H) |
| Example | 17 | Ag | 0.030 | 31.5 | Sn | 0.030 | 21.8 | | | | None | Cu—30Zn(¼H) |
| | 18 | Sn—Ag50 | 0.030 | 26.7 | | | | | | | None | Cu—30Zn(¼H) |
| Target | | | 0.002≤ ≤0.2 | 1≤ ≤150 | | 0.001≤ ≤0.3 | 1≤ ≤330 | | | | | |

| | | XPS (Depth) | | | Contact Resistance [mΩ] | Heat Resistance Contact Resistance [mΩ] | Salt Spray Contact Resistance [mΩ] | Gas Corrosion Resistance | | Solder Wetting Zero Cross Time [sec] | Comprehensive Judgment |
|---|---|---|---|---|---|---|---|---|---|---|---|
| | | Order of $D_1$ and $D_2$ | $D_1$ [at %] | $D_2$ [at %] | | | | Sulfurous Acid Gas Contact Resistance [mΩ] | Hydrogen Sulfide Contact Resistance [mΩ] | | |
| Example | 3 | $D_1 \Rightarrow D_2$ | 35 | 87 | 1-3 | 2-4 | 2-4 | 2-4 | 2-4 | 1-3 | ○ |
| | 5 | $D_1 \Rightarrow D_2$ | 12 | 14 | 1-3 | 6-9 | 4-7 | 5-8 | 6-9 | 4-5 | ○ |
| Comparative | 14 | $D_1$ | 12 | <10 | 1-3 | | | | | 5< | X |
| | 16 | $D_1 \Rightarrow D_2$ | <10 | 14 | 1-3 | | | | 10< | 4-5 | X |
| Example | 17 | $D_2 \Rightarrow D_1$ | | | 1-3 | | | | 10< | 1-3 | X |
| | 18 | $D_1 \approx D_2$ | | | 1-3 | | | | 10< | 1-3 | X |
| Target | | $D_1 \Rightarrow D_2$ | 10≤ | 10≤ | 10≤ | 10≤ | 10≤ | 10≤ | ≤10 | 5≤ | |

TABLE 15

| | | Surface Layer (A Layer) | | | Middle Layer (B Layer) | | | Underlayer (C Layer) | | | Heat Treatment Condition |
|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | |
| Example | 3 | Sn | 0.030 | 21.8 | Ag | 0.030 | 31.5 | | | | None |
| | 60 | Sn | 0.030 | 21.8 | Ag | 0.030 | 31.5 | | | | None |
| | 61 | Sn | 0.030 | 21.8 | Ag | 0.030 | 31.5 | Ni | 1.0 | 0.9 | None |
| | 62 | Sn | 0.030 | 21.8 | Ag | 0.030 | 31.5 | Ni | 1.0 | 0.9 | None |
| | 63 | Sn | 0.030 | 21.8 | Ag | 0.030 | 31.5 | Cr | 1.0 | 0.9 | None |
| | 64 | Sn | 0.030 | 21.8 | Ag | 0.030 | 31.5 | Mn | 1.0 | 0.9 | None |
| | 65 | Sn | 0.030 | 21.8 | Ag | 0.030 | 31.5 | Fe | 1.0 | 0.9 | None |
| | 66 | Sn | 0.030 | 21.8 | Ag | 0.030 | 31.5 | Co | 1.0 | 0.9 | None |
| | 67 | Sn | 0.030 | 21.8 | Ag | 0.030 | 31.5 | Cu | 1.0 | 0.9 | None |
| | 68 | Sn | 0.030 | 21.8 | Ag | 0.030 | 31.5 | Ni—Cr | 1.0 | 0.9 | None |
| | 69 | Sn | 0.030 | 21.8 | Ag | 0.030 | 31.5 | Ni—Mn | 1.0 | 0.9 | None |
| | 70 | Sn | 0.030 | 21.8 | Ag | 0.030 | 31.5 | Ni—Fe | 1.0 | 0.9 | None |
| | 71 | Sn | 0.030 | 21.8 | Ag | 0.030 | 31.5 | Ni—Co | 1.0 | 0.9 | None |
| | 72 | Sn | 0.030 | 21.8 | Ag | 0.030 | 31.5 | Ni—Cu | 1.0 | 0.9 | None |
| | 73 | Sn | 0.030 | 21.8 | Ag | 0.030 | 31.5 | Ni—B | 1.0 | 0.9 | None |
| | 74 | Sn | 0.030 | 21.8 | Ag | 0.030 | 31.5 | Ni—P | 1.0 | 0.9 | None |
| | 75 | Sn | 0.030 | 21.8 | Ag | 0.030 | 31.5 | Ni—Sn | 1.0 | 0.9 | None |
| | 76 | Sn | 0.030 | 21.8 | Ag | 0.030 | 31.5 | Ni—Zn | 1.0 | 0.9 | None |
| Target | | | 0.002 ≤ ≤0.2 | 1 ≤ ≤150 | | 0.001 ≤ ≤0.3 | 1 ≤ ≤330 | | | | |

| | | | Inserting/Extracting Force | | | | Gas Corrosion Resistance | | | Solder |
|---|---|---|---|---|---|---|---|---|---|---|
| | | | Maximum Inserting | | | | | | | |
| | | Base Material Composition | Maximum Inserting Force [N] | Maximum Inserting Force/Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | Wetting Zero Cross Time [sec] |
| Example | 3 | Cu—30Zn(¼H) | 5.04 | 84 | 1-3 | 2-4 | 2-4 | 2-4 | 2-4 | 1-3 |
| | 60 | Cu—30Zn(H) | 4.86 | 81 | 1-3 | 2-4 | 2-4 | 2-4 | 2-4 | 1-3 |
| | 61 | Cu—30Zn(H) | 4.44 | 74 | 1-3 | 1-4 | 1-4 | 1-4 | 1-4 | 1-3 |
| | 62 | Cu—30Zn(H) | 4.44 | 74 | 1-3 | 1-4 | 1-4 | 1-4 | 1-4 | 1-3 |
| | 63 | Cu—30Zn(H) | 3.78 | 63 | 1-3 | 1-4 | 1-4 | 1-4 | 1-4 | 1-3 |
| | 64 | Cu—30Zn(H) | 4.62 | 77 | 1-3 | 1-4 | 1-4 | 1-4 | 1-4 | 1-3 |
| | 65 | Cu—30Zn(H) | 4.44 | 74 | 1-3 | 1-4 | 1-4 | 1-4 | 1-4 | 1-3 |
| | 66 | Cu—30Zn(H) | 4.32 | 72 | 1-3 | 1-4 | 1-4 | 1-4 | 1-4 | 1-3 |
| | 67 | Cu—30Zn(H) | 4.56 | 76 | 1-3 | 1-4 | 1-4 | 1-4 | 1-4 | 1-3 |
| | 68 | Cu—30Zn(H) | 4.08 | 68 | 1-3 | 1-4 | 1-4 | 1-4 | 1-4 | 1-3 |
| | 69 | Cu—30Zn(H) | 4.56 | 76 | 1-3 | 1-4 | 1-4 | 1-4 | 1-4 | 1-3 |
| | 70 | Cu—30Zn(H) | 4.44 | 74 | 1-3 | 1-4 | 1-4 | 1-4 | 1-4 | 1-3 |
| | 71 | Cu—30Zn(H) | 4.2 | 70 | 1-3 | 1-4 | 1-4 | 1-4 | 1-4 | 1-3 |
| | 72 | Cu—30Zn(H) | 4.44 | 74 | 1-3 | 1-4 | 1-4 | 1-4 | 1-4 | 1-3 |
| | 73 | Cu—30Zn(H) | 3.78 | 63 | 1-3 | 1-4 | 1-4 | 1-4 | 1-4 | 1-3 |
| | 74 | Cu—30Zn(H) | 3.78 | 63 | 1-3 | 1-4 | 1-4 | 1-4 | 1-4 | 1-3 |
| | 75 | Cu—30Zn(H) | 4.32 | 72 | 1-3 | 1-4 | 1-4 | 1-4 | 1-4 | 1-3 |
| | 76 | Cu—30Zn(H) | 4.44 | 74 | 1-3 | 1-4 | 1-4 | 1-4 | 1-4 | 1-3 |
| Target | | | | <90 | ≤10 | ≤10 | ≤10 | ≤10 | ≤10 | ≤5 |

TABLE 16

| | | Surface Layer (A Layer) | | | Middle Layer (B Layer) | | | Underlayer (C Layer) | | | Heat Treatment Condition | Base Material Composition |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | | |
| Example | 3 | Sn | 0.030 | 21.8 | Ag | 0.030 | 31.5 | | | | None | Cu—30Zn(¼H) |
| | 60 | Sn | 0.030 | 21.8 | Ag | 0.030 | 31.5 | | | | None | Cu—30Zn(H) |
| | 77 | Sn | 0.030 | 21.8 | Ag | 0.030 | 31.5 | Ni | 0.03 | 0.03 | None | Cu—30Zn(H) |
| | 78 | Sn | 0.030 | 21.8 | Ag | 0.030 | 31.5 | Ni | 0.1 | 0.09 | None | Cu—30Zn(H) |
| | 61 | Sn | 0.030 | 21.8 | Ag | 0.030 | 31.5 | Ni | 1 | 0.89 | None | Cu—30Zn(H) |
| | 79 | Sn | 0.002 | 1.5 | Ag | 0.001 | 1.1 | Ni | 1 | 0.89 | None | Cu—30Zn(H) |

TABLE 16-continued

| | | | | | | | | | | | | |
|---|---|---|---|---|---|---|---|---|---|---|---|---|
| Comparative Example | 19 | Ag | 0.030 | 21.8 | Sn | 0.030 | 31.5 | Ni | 1 | 0.89 | None | Cu—30Zn(H) |
| | 20 | Sn—Ag50 | 0.030 | 21.8 | | | | Ni | 1 | 0.89 | None | Cu—30Zn(H) |
| | 21 | Sn | 0.002 | 1.5 | | | | Ni | 1 | 0.89 | None | Cu—30Zn(H) |
| | 22 | Sn | 0.001 | 0.7 | Ag | 0.001 | 1.1 | Ni | 1 | 0.89 | None | Cu—30Zn(H) |
| Target | | | 0.002≤ ≤0.2 | 1≤ ≤150 | | 0.001≤ ≤0.3 | 1≤ ≤330 | | | | | |

| | | XPS (Depth) | | | | Inserting/Extracting Force | | | | Gas Corrosion Resistance | | | |
|---|---|---|---|---|---|---|---|---|---|---|---|---|---|
| | | Order of $D_1, D_2, D_3$ | $D_1$ [at %] | $D_2$ [at %] | $D_3$ Thickness of 25% or More [nm] | Maximum Inserting Force [N] | Maximum Inserting Force/ Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | Solder Wetting Zero Cross Time [sec] |
| Example | 3 | $D_1$=>$D_2$ | 35 | 87 | | 5.04 | 84 | 1-3 | 2-4 | 2-4 | 2-4 | 2-4 | 1-3 |
| | 60 | $D_1$=>$D_2$ | 35 | 87 | | 4.86 | 81 | 1-3 | 2-4 | 2-4 | 2-4 | 2-4 | 1-3 |
| | 77 | $D_1$=>$D_2$=>$D_3$ | 35 | 87 | 40 | 4.80 | 80 | 1-3 | 2-4 | 2-4 | 2-4 | 2-4 | 1-3 |
| | 78 | $D_1$=>$D_2$=>$D_3$ | 35 | 87 | 100< | 4.62 | 77 | 1-3 | 14 | 1-4 | 1-4 | 1-4 | 1-3 |
| | 61 | $D_1$=>$D_2$=>$D_3$ | 35 | 87 | 100< | 4.44 | 74 | 1-3 | 1-4 | 1-4 | 1-4 | 1-4 | 1-3 |
| | 79 | $D_1$=>$D_2$=>$D_3$ | 12 | 14 | 100< | 4.32 | 72 | 1-3 | 1-4 | 4-7 | 5-8 | 6-9 | 1-3 |
| Comparative Example | 19 | $D_2$=>$D_1$=>$D_3$ | | | | | | 1-3 | | | | 10< | 1-3 |
| | 20 | $D_1$≈$D_2$=>$D_3$ | | | | | | 1-3 | | | | 10< | 1-3 |
| | 21 | $D_1$=>$D_3$ | 12 | <10 | 100< | | | 1-3 | | | | | 5< |
| | 22 | $D_1$=>$D_2$=>$D_3$ | <10 | 14 | 100< | | | 1-3 | | | | 10< | 4-5 |
| Target | | | | | | <90 | ≤10 | ≤10 | ≤10 | ≤10 | ≤10 | ≤5 | |

TABLE 17

| | | Surface Layer (A Layer) | | | Middle Layer (B Layer) | | | Underlayer (C Layer) | | | | |
|---|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | Heat Treatment Condition | Base Material Composition |
| Example | 61 | Sn | 0.030 | 21.8 | Ag | 0.030 | 31.5 | Ni | 1.0 | 0.89 | None | Cu—30Zn(H) |
| | 80 | Sn | 0.010 | 7.3 | Ag | 0.030 | 31.5 | Ni | 1.0 | 0.89 | None | Cu—30Zn(H) |
| | 81 | Sn | 0.005 | 3.6 | Ag | 0.030 | 31.5 | Ni | 1.0 | 0.89 | None | Cu—30Zn(H) |
| | 82 | Sn | 0.100 | 72.8 | Ag | 0.030 | 31.5 | Ni | 1.0 | 0.89 | None | Cu—30Zn(H) |
| | 83 | Sn | 0.200 | 145.6 | Ag | 0.030 | 31.5 | Ni | 1.0 | 0.89 | None | Cu—30Zn(H) |
| Target | | | 0.002≤ ≤0.2 | 1≤ ≤150 | | 0.001≤ ≤0.3 | 1≤ ≤330 | | | | | |

| | | Whisker | | Inserting/Extracting Force | | | | Gas Corrosion Resistance | | | | Solder |
|---|---|---|---|---|---|---|---|---|---|---|---|---|
| | | Number of Whiskers of Shorter Than 20 μm in Length [number] | Number of Whiskers of 20 μm or Longer in Length [number] | Maximum Inserting Force [N] | Maximum Inserting Force/ Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | | Wetting Zero Cross Time [sec] |
| Example | 61 | 0 | 0 | 4.44 | 74 | 1-3 | 1-4 | 1-4 | 1-4 | 1-4 | | 1-3 |
| | 80 | 0 | 0 | 4.32 | 72 | 1-3 | 1-4 | 1-4 | 1-4 | 1-4 | | 1-3 |
| | 81 | 0 | 0 | 4.26 | 71 | 1-3 | 1-4 | 2-6 | 3-7 | 4-7 | | 1-3 |

TABLE 17-continued

| | | | | | | | | | | | |
|---|---|---|---|---|---|---|---|---|---|---|---|
| | 82 | 0 | 0 | 4.56 | 76 | 1-3 | 1-4 | 1-4 | 1-4 | 1-4 | 1-3 |
| | 83 | ≤1 | 0 | 4.8 | 80 | 1-3 | 1-4 | 1-4 | 1-4 | 1-4 | 1-3 |
| Target | | | 0 | | <90 | ≤10 | ≤10 | ≤10 | ≤10 | ≤10 | ≤5 |

TABLE 18

| | | Surface Layer (A Layer) | | | Middle Layer (B Layer) | | | Underlayer (C Layer) | | | |
|---|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] | Heat Treatment Condition |
| Example | 61 | Sn | 0.03 | 21.8 | Ag | 0.03 | 31.5 | Ni | 1 | 0.89 | None |
| | 84 | Sn | 0.03 | 21.8 | Ag | 0.001 | 1.1 | Ni | 1 | 0.89 | None |
| | 85 | Sn | 0.03 | 21.8 | Ag | 0.007 | 7.4 | Ni | 1 | 0.89 | None |
| | 86 | Sn | 0.03 | 21.8 | Ag | 0.1 | 105.0 | Ni | 1 | 0.89 | None |
| | 87 | Sn | 0.03 | 21.8 | Ag | 0.3 | 315.0 | Ni | 1 | 0.89 | None |
| Target | | | 0.002≤ ≤0.2 | 1≤ ≤150 | | 0.001≤ ≤0.3 | 1≤ ≤330 | | | | |

| | | | Inserting/Extracting Force | | | Gas Corrosion Resistance | | | | | Solder |
|---|---|---|---|---|---|---|---|---|---|---|---|
| | | Base Material Composition | Maximum Inserting Force [N] | Maximum Inserting Force/Maximum Inserting Force of Comparative Example 1 [%] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] | | Wetting Zero Cross Time [sec] |
| Example | 61 | Cu—30Zn(H) | 4.44 | 74 | 1-3 | 1-4 | 1-4 | 1-4 | 1-4 | | 1-3 |
| | 84 | Cu—30Zn(H) | 4.20 | 70 | 1-3 | 6-9 | 1-4 | 1-4 | 1-4 | | 4-5 |
| | 85 | Cu—30Zn(H) | 4.26 | 71 | 1-3 | 2-5 | 1-4 | 1-4 | 1-4 | | 2-3 |
| | 86 | Cu—30Zn(H) | 4.50 | 75 | 1-3 | 1-4 | 1-4 | 1-4 | 1-4 | | 1-3 |
| | 87 | Cu—30Zn(H) | 4.86 | 81 | 1-3 | 1-3 | 1-4 | 1-4 | 1-4 | | 1-3 |
| Target | | | | <90 | ≤10 | ≤10 | ≤10 | ≤10 | ≤10 | | ≤5 |

TABLE 19

| | | Surface Layer (A Layer) | | | Middle Layer (B Layer) | | | Underlayer (C Layer) | | |
|---|---|---|---|---|---|---|---|---|---|---|
| | | Composition | Thickness [μm] | Deposition Amount [μg/cm²] | Composition | Thickness [μm] | Deposition Amount [μg/cm²] | Composition | Thickness [μm] | Deposition Amount [mg/cm²] |
| Example | 61 | Sn | 0.030 | 21.8 | Ag | 0.030 | 31.5 | Ni | 1.0 | 0.89 |
| | 88 | Sn | 0.030 | 21.8 | Ag | 0.030 | 31.5 | Ni (semi-bright) | 1.0 | 0.89 |
| | 89 | Sn | 0.030 | 21.8 | Ag | 0.030 | 31.5 | Ni (bright) | 1.0 | 0.89 |
| | 74 | Sn | 0.030 | 21.8 | Ag | 0.030 | 31.5 | Ni—P | 1.0 | 0.9 |
| | 90 | Sn | 0.030 | 21.8 | Ag | 0.030 | 31.5 | Ni (semi-bright) | 0.80 | 0.71 |
| | 91 | Sn | 0.030 | 21.8 | Ag | 0.030 | 31.5 | Ni (semi-bright) | 0.50 | 0.44 |
| | 92 | Sn | 0.030 | 21.8 | Ag | 0.030 | 31.5 | Ni (bright) | 0.60 | 0.53 |
| | 93 | Sn | 0.030 | 21.8 | Ag | 0.030 | 31.5 | Ni (bright) | 0.30 | 0.27 |
| | 94 | Sn | 0.030 | 21.8 | Ag | 0.030 | 31.5 | Ni—P | 0.20 | 0.18 |
| | 95 | Sn | 0.030 | 21.8 | Ag | 0.030 | 31.5 | Ni—P | 0.05 | 0.04 |
| Target | | | 0.002≤ ≤0.2 | 1≤ ≤150 | | 0.001≤ ≤0.3 | 1≤ ≤330 | | | |

| | | Underlayer (C Layer) | | | | | | Inserting/Extracting Force | |
|---|---|---|---|---|---|---|---|---|---|
| | | Vickers Hardness | | Indentation Hardness | | | | | Maximum Inserting |
| | | Hv | Correlation between Vickers Hardness and Expression Expression: −376.22Ln (thickness) + 86.411 | [Mpa] | Correlation between Indentation Hardness and Expression Expression: −3998.4Ln (thickness) + 1178.9 | Heat Treatment Condition | Base Material Composition | Maximum Inserting Force [N] | Force/Maximum Inserting Force of Comparative Example 1 [%] |
| Example | 61 | 130 | 86.4 =>Vickers Hardness ≥ expression | 1500 | 1178.9 =>Indentation Hardness ≥ expression | None | Cu—30Zn(H) | 4.44 | 74 |

TABLE 19-continued

|  |  |  |  |  |  |  |  |  |
|---|---|---|---|---|---|---|---|---|
| 88 | 300 | 86.4 =>Vickers Hardness ≥ expression | 3400 | 1178.9 =>Indentation Hardness ≥ expression | None | Cu—30Zn(H) | 4.26 | 71 |
| 89 | 500 | 86.4 =>Vickers Hardness ≥ expression | 5500 | 1178.9 =>Indentation Hardness ≥ expression | None | Cu—30Zn(H) | 4.02 | 67 |
| 74 | 1200 | 86.4 =>Vickers Hardness ≥ expression | 13000 | 1178.9 =>Indentation Hardness ≥ expression | None | Cu—30Zn(H) | 3.78 | 63 |
| 90 | 300 | 170.4 =>Vickers Hardness ≥ expression | 3400 | 2071.1 =>Indentation Hardness ≥ expression | None | Cu—30Zn(H) | 4.32 | 72 |
| 91 | 300 | 347.2 =>Vickers Hardness ≤ expression | 3400 | 3950.4 =>Indentation Hardness ≤ expression | None | Cu—30Zn(H) | 4.56 | 76 |
| 92 | 500 | 278.6 =>Vickers Hardness ≥ expression | 5500 | 3221.4 =>Indentation Hardness ≥ expression | None | Cu—30Zn(H) | 4.38 | 73 |
| 93 | 500 | 539.4 =>Vickers Hardness ≤ expression | 5500 | 5992.9 =>Indentation Hardness ≤ expression | None | Cu—30Zn(H) | 4.68 | 78 |
| 94 | 1200 | 691.9 =>Vickers Hardness ≥ expression | 13000 | 7614.1 =>Indentation Hardness ≥ expression | None | Cu—30Zn(H) | 4.38 | 73 |
| 95 | 1200 | 1213.5 =>Vickers Hardness ≤ expression | 13000 | 13157.0 =>Indentation Hardness ≤ expression | None | Cu—30Zn(H) | 4.80 | 80 |
| Target |  |  |  |  |  |  |  | <90 |

TABLE 20

| | | Surface Layer (A Layer) | | | Middle Layer (B Layer) | | | Underlayer (C Layer) | |
|---|---|---|---|---|---|---|---|---|---|
| | | | | Deposition | | | Deposition | | |
| | | Composition | Thickness [μm] | Amount [μg/cm²] | Composition | Thickness [μm] | Amount [μg/cm²] | Composition | Thickness [μm] |
| Example | 61 | Sn | 0.030 | 21.8 | Ag | 0.030 | 31.5 | Ni | 1.0 |
| | 88 | Sn | 0.030 | 21.8 | Ag | 0.030 | 31.5 | Ni (semi-bright) | 1.0 |
| | 89 | Sn | 0.030 | 21.8 | Ag | 0.030 | 31.5 | Ni (bright) | 1.0 |
| | 74 | Sn | 0.030 | 21.8 | Ag | 0.030 | 31.5 | Ni—P | 1.0 |
| Target | | | 0.002≤ ≤0.2 | 1≤ ≤150 | | 0.001≤ ≤0.3 | 1≤ ≤330 | | |

| | | Underlayer (C Layer) | | | | | |
|---|---|---|---|---|---|---|---|
| | | Deposition Amount [mg/cm²] | Vickers Hardness Hv | Indentation Hardness [MPa] | Heat Treatment Condition | Base Material Composition | Bending Workability |
| Example | 61 | 0.89 | 130 | 1500 | None | Cu—30Zn(H) | ○ |
| | 88 | 0.89 | 300 | 3400 | None | Cu—30Zn(H) | ○ |
| | 89 | 0.89 | 600 | 6700 | None | Cu—30Zn(H) | ○ |
| | 74 | 0.89 | 1200 | 13000 | None | Cu—30Zn(H) | X |
| Target | | | | | | | |

TABLE 21

| | | Surface Layer (A Layer) | | | Middle Layer (B Layer) | | | Underlayer (C Layer) | | |
|---|---|---|---|---|---|---|---|---|---|---|
| | | | | | | | | | | Deposition |
| | | Composition | Thickness [μm] | Deposition Amount [μg/cm²] | Composition | Thickness [μm] | Deposition Amount [μg/cm²] | Composition | Thickness [μm] | Amount [mg/cm²] |
| Example | 1 | Sn | 0.200 | 145.6 | Ag | 0.300 | 315.0 | | | |
| | 54 | Sn | 0.200 | 145.6 | Ag | 0.3 | 315 | | | |
| | 55 | Sn | 0.200 | 145.6 | Ag | 0.3 | 315 | | | |
| | 56 | Sn | 0.200 | 145.6 | Ag | 0.3 | 315 | | | |
| Target | | | 0.002≤ ≤0.2 | 1≤ ≤150 | | 0.001≤ ≤0.3 | 1≤ ≤330 | | | |

TABLE 21-continued

|  |  | Heat Treatment Condition | Base Material Composition | Vickers Hardness Hv | Indentation Hardness [MPa] | Elongation [%] | Minimum Bending Radius Ratio MBE/t | Inserting/Extracting Force | | Bending Workability |
|---|---|---|---|---|---|---|---|---|---|---|
|  |  |  |  |  |  |  |  | Maximum Inserting Force [N] | Maximum Inserting Force/ Maximum Inserting Force of Comparative Example 1 [%] |  |
| Example | 1 | None | Cu—Zn | 75 | 800 | 30 | 2 | 5.34 | 89 | ○ |
|  | 54 | None | Cu—30Zn(H) | 100 | 1250 | 30 | 2 | 5.10 | 85 | ○ |
|  | 55 | None | Cu—10Sn—0.15P(EH) | 270 | 3700 | 5 | 3 | 4.20 | 70 | ○ |
|  | 56 | None | Cu—3Ti(SH) | 320 | 4500 | 4 | 4 | 3.90 | 65 | X |
| Target |  |  |  |  |  |  |  |  | <90 |  |

TABLE 22

|  |  | Surface Layer (A Layer) | | | Middle Layer (B Layer) | | | Underlayer (C Layer) | | | Heat Treatment Condition | Base Material Composition |
|---|---|---|---|---|---|---|---|---|---|---|---|---|
|  |  | Composition | Thickness [μm] | Deposition Amount [μg/cm²] | Composition | Thickness [μm] | Deposition Amount [mg/cm²] | Composition | Thickness [μm] | Deposition Amount [mg/cm²] |  |  |
| Example | 61 | Sn | 0.030 | 21.8 | Ag | 0.030 | 31.5 | Ni | 1.0 | 0.89 | None | Cu—30Zn(H) |
|  | 84 | Sn | 0.030 | 21.8 | Ag | 0.001 | 1.1 | Ni | 1.0 | 0.89 | None | Cu—30Zn(H) |
|  | 79 | Sn | 0.002 | 1.5 | Ag | 0.001 | 1.1 | Ni | 1.0 | 0.89 | None | Cu—30Zn(H) |
|  | 96 | Sn | 0.030 | 21.8 | Ag | 0.030 | 31.5 | Ni | 1.0 | 0.89 | 300° C. × 5 sec | Cu—30Zn(H) |
|  | 97 | Sn | 0.030 | 21.8 | Ag | 0.030 | 31.5 | Ni | 1.0 | 0.89 | 300° C. × 20 sec | Cu—30Zn(H) |
| Comparative Example | 22 | Sn | 0.001 | 0.7 | Ag | 0.001 | 1.1 | Ni | 1.0 | 0.89 | None | Cu—30Zn(H) |
|  | 23 | Sn | 0.030 | 21.8 |  |  |  | Ni | 1.0 | 0.89 | None | Cu—30Zn(H) |
| Target |  |  | 0.002≤ ≤0.2 | 1≤ ≤150 |  | 0.001≤ ≤0.3 | 1≤ ≤330 |  |  |  |  |  |

|  |  | XPS (Depth) Thickness of (Region) Having a Concentration of Ag, Au, Pt, Pd, Ru, Rh, Os, Ir of 40 at % or higher between $D_1$ and $D_3$ [nm] | XPS (Survey) | | | | Gas Corrosion Resistance | | | | | Solder Wetting Zero Cross Time [sec] |
|---|---|---|---|---|---|---|---|---|---|---|---|---|
|  |  |  | Concentration of Sn, In of Surface [at] | Concentration of Ag, Au, Pt, Pd, Ru, Rh, Os, Ir of Surface [at %] | Concentration of O of Surface [at %] | Contact Resistance [mΩ] | Heat Resistance Contact Resistance [mΩ] | Salt Spray Contact Resistance [mΩ] | Sulfurous Acid Gas Contact Resistance [mΩ] | Hydrogen Sulfide Contact Resistance [mΩ] |  |  |
| Example | 61 | 30 | 7.3 | 2.6 | 24.1 | 1-3 | 1-4 | 1-4 | 1-4 | 1-4 | 1-3 |
|  | 84 | 1 | 7.4 | 2.1 | 25.1 | 1-3 | 3-6 | 1-4 | 1-4 | 1-4 | 4-5 |
|  | 79 | 1 | 3.4 | 2.5 | 35.1 | 1-3 | 3-6 | 4-7 | 5-8 | 6-9 | 4-5 |
|  | 96 | 30 | 4.1 | 1.7 | 38.2 | 1-3 | 1-4 | 1-4 | 1-4 | 1-4 | 1-3 |
|  | 97 | 30 | 2.2 | 1.2 | 57.1 | 3-5 | 3-6 | 3-5 | 3-5 | 3-5 | 3-5 |
| Comparative Example | 22 | 1 | 1.2 | 2.5 | 24.1 | 1-3 |  |  |  | 10< | 4-5 |
|  | 23 |  | 7.3 |  | 25.1 | 1-3 |  |  |  |  | 5< |
| Target |  |  |  |  |  | ≤10 | ≤10 | ≤10 | ≤10 | ≤10 | ≤5 |

Examples 1 to 97 were metal materials for electronic components, which were excellent in all of the low insertability/extractability, low whisker formability, and durability.

Comparative Example 1 was a blank material.

Comparative Example 2 was fabricated by making thin the Sn plating of the blank material of Comparative Example 1, but was poor in the solder wettability.

Comparative Example 3 was fabricated by being subjected to no heat treatment, in comparison with Comparative Example 2, but was higher in the inserting/extracting force than the target.

Comparative Example 4 was fabricated by carrying out a Cu plating for the middle layer, in comparison with Comparative Example 2, but exhibited an inserting/extracting force of 90% of Comparative Example 1.

Comparative Example 5 was fabricated by making the Sn plating thin, in comparison with Comparative Example 4, but was poor in the solder wettability.

Comparative Example 6 was fabricated by being subjected to no heat treatment, in comparison with Comparative Example 5, but was higher in the inserting/extracting force than the target.

Comparative Example 7 was fabricated by being subjected to a Cu plating for the underlayer, in comparison with the blank material of Comparative Example 1, but exhibited no variations in the properties in comparison with Comparative Example 1.

Comparative Example 8 was fabricated by making the Ni plating of the underlayer thick in comparison with the blank material of Comparative Example 1, but exhibited no variations in the properties in comparison with Comparative Example 1.

Comparative Example 9 was fabricated by making the Sn plating of the surface layer thick in comparison with Example 1, but was higher in the inserting/extracting force than the target.

Comparative Example 10 was fabricated by making the Ag plating of the middle layer thin in comparison with Comparative Example 9, but though exhibiting an inserting/extracting force below the target, surely generated one or more whiskers of shorter than 20 μm though there was no whisker of a length of 20 μm or longer, which was the target.

Comparative Example 11 was fabricated by making the Ag plating of the middle layer thick in comparison with Example 1, but was higher in the inserting/extracting force than the target.

Comparative Example 12 was fabricated by carrying out no Ag plating of the middle layer in comparison with Comparative Example 11, but was poor in the solder wettability.

Comparative Example 13 was fabricated by making the Ag plating of the middle layer thick in comparison with Example 4, but was higher in the inserting/extracting force than the target.

Comparative Example 14 was fabricated by carrying out no Ag plating of the middle layer in comparison with Comparative Example 13, but was poor in the solder wettability.

Comparative Example 15 was fabricated by making thin the Sn plating of the surface layer in comparison with Example 4, but was poor in the gas corrosion resistance, and higher in the contact resistance after the hydrogen sulfide gas corrosion test than the target.

Comparative Example 16 was fabricated by making thin the Sn plating of the surface layer in comparison with Example 5, but had a maximum value of the atomic concentration (at %) of Sn or In of the surface layer (A layer) of 10 at % or lower in a depth measurement by XPS (X-ray photoelectron spectroscopy), and was poor in the gas corrosion resistance, and higher in the contact resistance after the hydrogen sulfide gas corrosion test than the target.

Comparative Example 17 was fabricated by reversing the plating order of Sn and Ag in comparison with Example 3, but was poor in the gas corrosion resistance and higher in the contact resistance after the hydrogen sulfide gas corrosion test than the target, because in a depth measurement by XPS (X-ray photoelectron spectroscopy), the position ($D_1$) where the atomic concentration (at %) of Sn or In of the surface layer (A layer) indicated the maximum value and the position ($D_2$) where the atomic concentration (at %) of Ag, Au, Pt, Pd, Ru, Rh, Os or Ir of the middle layer (B layer) indicated the maximum value were present in the order of $D_2$ and $D_1$.

Comparative Example 18 was poor in the gas corrosion resistance and higher in the contact resistance after the hydrogen sulfide gas corrosion test than the target, because in a depth measurement by XPS (X-ray photoelectron spectroscopy), the position ($D_1$) where the atomic concentration (at %) of Sn or In of the surface layer (A layer) indicated the maximum value and the position ($D_2$) where the atomic concentration (at %) of Ag, Au, Pt, Pd, Ru, Rh, Os or Ir of the middle layer (B layer) indicated the maximum value were $D_1 \cong D_2$.

Comparative Example 19 was fabricated by reversing the Sn and Ag plating order in comparison with Example 60, but was poor in the gas corrosion resistance and higher in the contact resistance after the hydrogen sulfide gas corrosion test than the target, because in a depth measurement by XPS (X-ray photoelectron spectroscopy), the position ($D_1$) where the atomic concentration (at %) of Sn or In of the surface layer (A layer) indicated the maximum value and the position ($D_2$) where the atomic concentration (at %) of Ag, Au, Pt, Pd, Ru, Rh, Os or Ir of the middle layer (B layer) indicated the maximum value were present in the order of $D_2$ and $D_1$.

Comparative Example 20 was poor in the gas corrosion resistance and higher in the contact resistance after the hydrogen sulfide gas corrosion test than the target, because in a depth measurement by XPS (X-ray photoelectron spectroscopy), the position ($D_1$) where the atomic concentration (at %) of Sn or In of the surface layer (A layer) indicated the maximum value and the position ($D_2$) where the atomic concentration (at %) of Ag, Au, Pt, Pd, Ru, Rh, Os or Ir of the middle layer (B layer) indicated the maximum value were $D_1 \cong D_2$.

Comparative Example 21 was fabricated by carrying out no Ag plating of the middle layer in comparison with Example 79, but was poor in the solder wettability.

Comparative Example 22 was fabricated by making thin the Sn plating of the surface layer in comparison with Example 79, but had a position ($D_1$) indicating a maximum value of the atomic concentration (at %) of Sn or In of the surface layer (A layer) of 10 at % or lower in a depth measurement by XPS (X-ray photoelectron spectroscopy), and was poor in the gas corrosion resistance, and higher in the contact resistance after the hydrogen sulfide gas corrosion test than the target.

Comparative Example 23 was fabricated by carrying out no Ag plating of the middle layer in comparison with Example 84, but was poor in the solder wettability.

Figure 2:
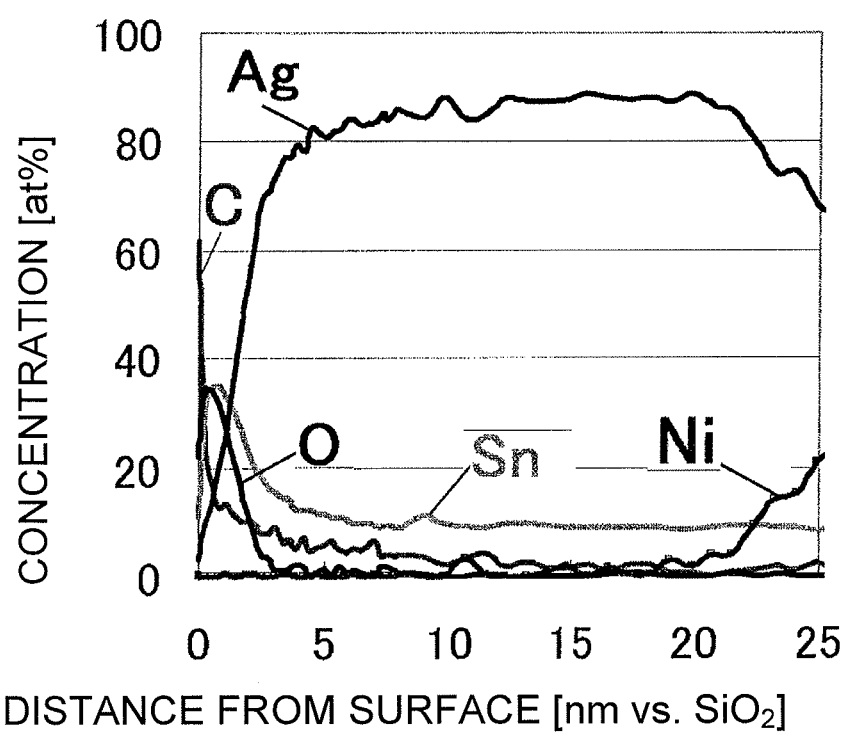
FIG. 2 is a depth measurement result by XPS (X-ray photoelectron spectroscopy) in Example 61.

FIG. 2 shows a depth measurement result by XPS (X-ray photoelectron spectroscopy) in Example 61. It is clear from FIG. 2 that the position ($D_1$) where the atomic concentration (at %) of Sn or In of the surface layer (A layer) indicated the maximum value and the position ($D_2$) where the atomic concentration (at %) of Ag, Au, Pt, Pd, Ru, Rh, Os or Ir of the middle layer (B layer) indicated the maximum value were present in the order of $D_1$ and $D_2$; and $D_1$ had 35 at %, and $D_2$ had 87 at %.

Figure 3:
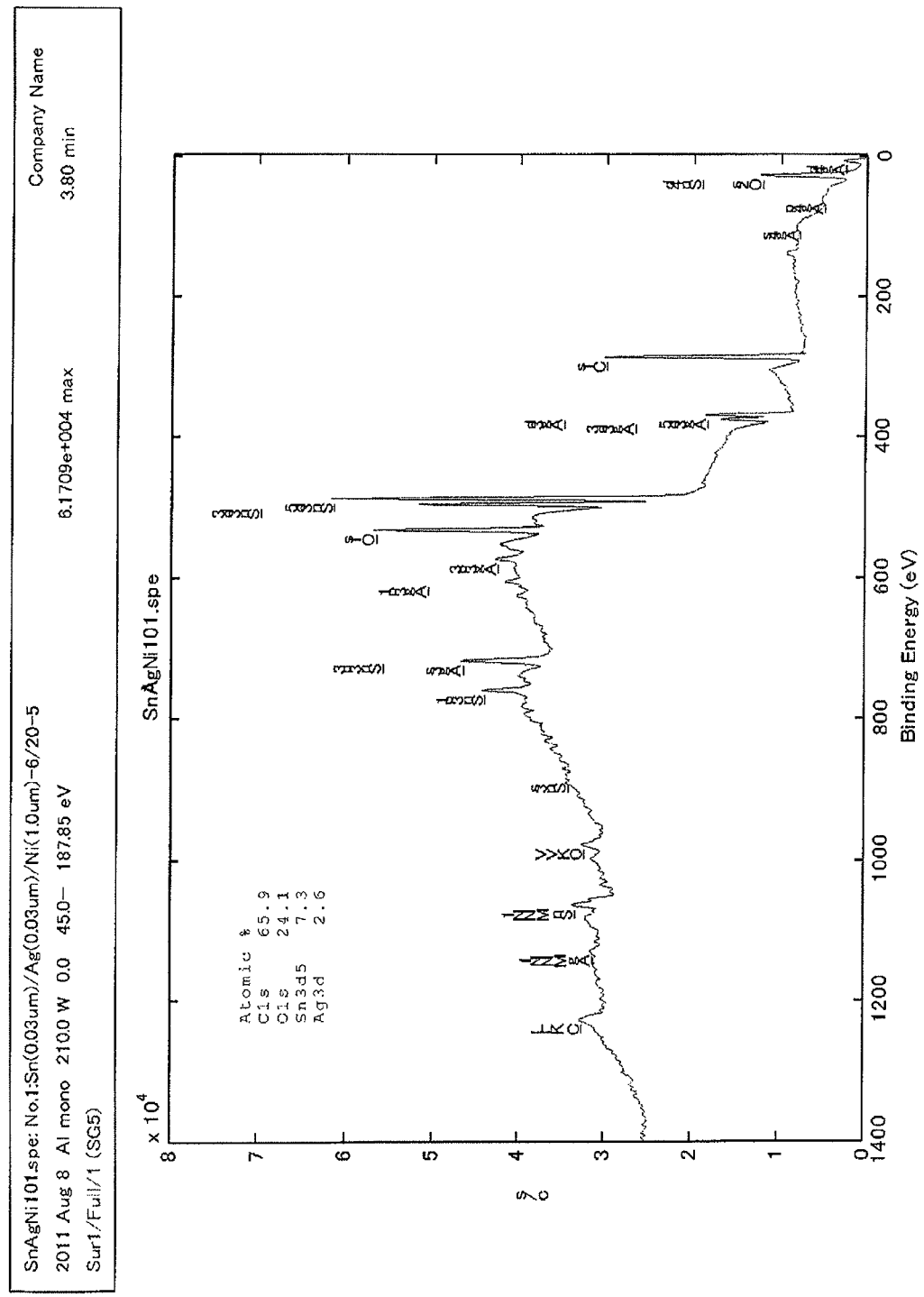
FIG. 3 is a survey measurement result by XPS (X-ray photoelectron spectroscopy) in Example 61.

FIG. 3 shows a survey measurement result by XPS (X-ray photoelectron spectroscopy) in Example 61. It is clear from FIG. 3 that O was 24.1 at %; Ag was 2.6 at %; and Sn was 7.3 at %.

REFERENCE SIGNS LIST

10 METAL MATERIAL FOR ELECTRONIC COMPONENTS
11 BASE MATERIAL
12 UNDERLAYER (C LAYER)
13 MIDDLE LAYER (B LAYER)
14 SURFACE LAYER (A LAYER)

The invention claimed is:

1. A metal material for electronic component, having low whisker formability and high durability, comprising:
   a base material;
   an A layer constituting a surface layer on the base material and formed of Sn, In or an alloy thereof; and
   a B layer constituting a middle layer provided between the base material and the A layer and formed of Ag, Au, Pt, Pd, Ru, Rh, Os, Ir or an alloy thereof,
   wherein the surface layer (A layer) has the following constituents (i) or (ii):
   (i) a thickness of 0.002 to 0.2 μm,
   (ii) a deposition amount of Sn, In of 1 to 150 μg/cm$^2$; and the middle layer (B layer) has the following constituents (iii) or (iv):
   (iii) a thickness of 0.001 to 0.3 μm,
   (iv) a deposition amount of Ag, Au, Pt, Pd, Ru, Rh, Os, Ir of 1 to 330 μg/cm$^2$;
   wherein the surface layer (A layer) has a surface arithmetic mean deviation (Ra) of 0.1 μm or lower.

2. The metal material for electronic component according to claim 1, wherein the surface layer (A layer) has an alloy composition comprising 50 mass % or more of Sn, In or a total of Sn and In, and the other alloy component(s) comprising one or two or more elements selected from the group consisting of Ag, As, Au, Bi, Cd, Co, Cr, Cu, Fe, Mn, Mo, Ni, Pb, Sb, W, Zn.

3. The metal material for electronic component according to claim 1, wherein the middle layer (B layer) has an alloy composition comprising 50 mass % or more of Ag, Au, Pt, Pd, Ru, Rh, Os, Ir or a total of Ag, Au, Pt, Pd, Ru, Rh, Os and Ir, and the other alloy component(s) comprising one or two or more elements selected from the group consisting of Bi, Cd, Co, Cu, Fe, In, Mn, Mo, Ni, Pb, Sb, Se, Sn, W, Tl, Zn.

4. The metal material for electronic component according to claim 1, wherein when a depth analysis by XPS (X-ray photoelectron spectroscopy) is carried out, a position ($D_1$) where an atomic concentration (at %) of Sn or In of the surface layer (A layer) is a maximum value and a position ($D_2$) where an atomic concentration (at %) of Ag, Au, Pt, Pd, Ru, Rh, Os or Ir of the middle layer (B layer) is a maximum value are present in the order of $D_1$ and $D_2$ from the surface.

5. The metal material for electronic component according to claim 1, wherein when a depth analysis by XPS (X-ray photoelectron spectroscopy) is carried out, the surface layer (A layer) has a maximum value of an atomic concentration (at %) of Sn or In of 10 at % or higher.

6. The metal material for electronic component according to claim 1, wherein when a depth analysis by XPS (X-ray photoelectron spectroscopy) is carried out, the middle layer (B layer) has a maximum value of an atomic concentration (at %) of Ag, Au, Pt, Pd, Ru, Rh, Os or Ir of 10 at % or higher.

7. The metal material for electronic component according to claim 1, wherein the surface layer (A layer) has a thickness of 0.01 to 0.1 μm, the surface layer (A layer) has a deposition amount of Sn, In of 7 to 75 μg/cm$^2$, and the metal material is whisker-free.

8. The metal material for electronic component according to claim 1, wherein the middle layer (B layer) has a thickness of 0.005 to 0.1 μm, and the middle layer (B layer) has a deposition amount of Ag, Au, Pt, Pd, Ru, Rh, Os, Ir of 4 to 120 μg/cm$^2$.

9. The metal material for electronic component according to claim 1, further comprising a C layer provided between the base material and the B layer and constituting an underlayer, and formed of one or two or more selected from the group consisting of Ni, Cr, Mn, Fe, Co, Cu.

10. The metal material for electronic component according to claim 9, wherein the underlayer (C layer) has an alloy composition comprising 50 mass % or more of a total of Ni, Cr, Mn, Fe, Co, Cu, and further comprising one or two or more selected from the group consisting of B, P, Sn, Zn.

11. The metal material for electronic component according to claim 9, wherein when a depth analysis by XPS (X-ray photoelectron spectroscopy) is carried out, a position ($D_1$) where an atomic concentration (at %) of Sn or In of the surface layer (A layer) is a maximum value, a position ($D_2$) where an atomic concentration (at %) of Ag, Au, Pt, Pd, Ru, Rh, Os or Ir of the middle layer (B layer) is a maximum value and a position ($D_3$) where an atomic concentration (at %) of Ni, Cr, Mn, Fe, Co or Cu of the underlayer (C layer) is a maximum value are present in the order of $D_1$, $D_2$ and $D_3$ from the surface.

12. The metal material for electronic component according to claim 9, wherein when a depth analysis by XPS (X-ray photoelectron spectroscopy) is carried out, the surface layer (A layer) has a maximum value of an atomic concentration (at %) of Sn or In of 10 at % or higher, and the middle layer (B layer) has a maximum value of an atomic concentration (at %) of Ag, Au, Pt, Pd, Ru, Rh, Os or Ir of 10 at % or higher; and a depth where the underlayer (C layer) has an atomic concentration (at %) of Ni, Cr, Mn, Fe, Co or Cu of 25% or higher is 50 nm or more.

13. The metal material for electronic component according to claim 9, wherein the underlayer (C layer) has a thickness of 0.05 μm or larger, and the underlayer (C layer) has a deposition amount of Ni, Cr, Mn, Fe, Co, Cu of 0.03 mg/cm$^2$ or larger.

14. The metal material for electronic component according to claim 9, wherein when a depth analysis by XPS (X-ray photoelectron spectroscopy) is carried out, between a position ($D_1$) where an atomic concentration (at %) of Sn or In of the surface layer (A layer) is a maximum value and a position ($D_3$) where an atomic concentration (at %) of Ni, Cr, Mn, Fe, Co, Cu or Zn of the underlayer (C layer) is a maximum value, a region having 40 at % or more of Ag, Au, Pt, Pd, Ru, Rh, Os or Ir is present in a thickness of 1 nm or larger.

15. The metal material for electronic component according to claim 1, wherein when an elemental analysis of a surface of the surface layer (A layer) is carried out by a survey measurement by XPS (X-ray photoelectron spectroscopy), a content of Sn, In is 2 at % or higher.

16. The metal material for electronic component according to claim 1, wherein when an elemental analysis of a surface of the surface layer (A layer) is carried out by a survey measurement by XPS (X-ray photoelectron spectroscopy), a content of Ag, Au, Pt, Pd, Ru, Rh, Os or Ir is lower than 7 at %.

17. The metal material for electronic component according to claim 1, wherein when an elemental analysis of a surface of the surface layer (A layer) is carried out by a survey measurement by XPS (X-ray photoelectron spectroscopy), a content of O is lower than 50 at %.

18. A connector terminal, wherein a metal material for electronic component according to claim 1 is used for a contact portion.

19. An FFC terminal, wherein a metal material for electronic component according to claim 1 is used for a contact portion.

20. An FPC terminal, wherein a metal material for electronic component according to claim 1 is used for a contact portion.

21. An electronic component, wherein a metal material for electronic component according to claim 1 is used for an electrode for external connection of the electronic component.

* * * * *